United States Patent
Obara et al.

(10) Patent No.: US 7,193,912 B2
(45) Date of Patent: Mar. 20, 2007

(54) SEMICONDUCTOR INTEGRATED CIRCUIT DEVICE

(75) Inventors: Tadahiro Obara, Ome (JP); Masatoshi Hasegawa, Hamura (JP); Yousuke Tanaka, Ome (JP); Tomofumi Hokari, Akishima (JP); Kenichi Tajima, Akishima (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 112 days.

(21) Appl. No.: 11/136,510

(22) Filed: May 25, 2005

(65) Prior Publication Data

US 2005/0265096 A1  Dec. 1, 2005

(30) Foreign Application Priority Data

May 25, 2004  (JP) .............................. 2004-154886

(51) Int. Cl.
G11C 7/00 (2006.01)
G11C 7/02 (2006.01)
G11C 11/34 (2006.01)

(52) U.S. Cl. ...................... 365/203; 365/182; 365/191; 365/205; 365/207; 257/E21.629; 257/E21.625

(58) Field of Classification Search ................ 365/203, 365/207, 191, 195, 196; 257/E21.625, E21.639
See application file for complete search history.

(56) References Cited

U.S. PATENT DOCUMENTS 6,031,779 A  2/2000 Takahashi et al. .......... 365/226
6,226,215 B1  5/2001 Yoon ..................... 365/230.03
6,331,959 B1 * 12/2001 Hirota ........................ 365/207
6,795,358 B2  9/2004 Tanaka et al. .............. 365/203
2001/0015928 A1  8/2001 Fujioka et al. ............. 365/203
2005/0265096 A1 * 12/2005 Obara et al. ................ 365/203

FOREIGN PATENT DOCUMENTS

| JP | 10-284705 | | 10/1998 |
| JP | 11-288600 | | 10/1999 |
| JP | 2001-100171 | | 4/2000 |
| JP | 2001-195271 | | 7/2000 |
| KR | 2005079800 A | * | 8/2005 |

* cited by examiner

Primary Examiner—Amir Zarabian
Assistant Examiner—Ly Duy Pham
(74) Attorney, Agent, or Firm—Miles & Stockbridge PC

(57) ABSTRACT

A DRAM whose operation is sped up and power consumption is reduced is provided. A pair of precharge MOSFETs for supplying a precharge voltage to a pair of input/output nodes of a CMOS sense amplifier is provided; the pair of input/output nodes are connected to a complementary bit-line pair via a selection switch MOSFET; a first equalize MOSFET is provided between the complementary bit-line pair for equalizing them; a memory cell is provided between one of the complementary bit-line pair and a word line intersecting with it; gate insulators of the selection switch MOSFETs and first equalize MOSFET are formed by first film thickness; a gate insulator of the precharge MOSFET is formed by second film thickness thinner than the first film thickness; a precharge signal corresponding to a power supply voltage is supplied to the precharge MOSFET; and an equalize signal and a selection signal corresponding to a boost voltage are supplied to the first equalize MOSFET and the selection switch MOSFET, respectively.

10 Claims, 16 Drawing Sheets

SEMICONDUCTOR INTEGRATED CIRCUIT DEVICE

CROSS-REFERENCE TO RELATED APPLICATION

The present application claims priority from Japanese patent application No. JP 2004-154886 filed on May 25, 2004, the content of which is hereby incorporated by reference into this application.

BACKGROUND OF THE INVENTION

The present invention relates to a semiconductor integrated circuit device and to, for example, a technique effectively applied to a shared-method sense amplifier circuit of a dynamic random access memory (hereinafter, simply referred to as "DRAM").

In a research of publicly known examples after the invention of the present application has been filed, the following techniques are reported as those relevant to precharge of complementary bit lines similarly to that of the invention of the present application. That is, Japanese Patent Laid-Open No. 2000-100171 (Patent Document 1) discloses a DRAM in which a precharge circuit is provided inside a shared MOSFET and an equalize MOSFET is provided outside the shared MOSFET (on a memory cell side); Japanese Patent Laid-Open No. 2000-195271 (Patent Document 2) discloses that a logic level is supplied as a precharge signal of a second precharge circuit provided in an area surrounded by a shared MOSFET and a first precharge circuit is provided outside the shared MOSFET; Japanese Patent Laid-Open No. 10-284705 (Patent Document 3) discloses a DRAM in which a precharge circuit and an equalize MOSFET provided in an area surrounded by a shared MOSFET are driven by VDD; and Japanese Patent Laid-Open No. 11-288600 (Patent Document 4) discloses that a precharge circuit and an equalize MOSFET provided in an area surrounded by a shared MOSFET are driven by an internal voltage Vint (<Vpp).

SUMMARY OF THE INVENTION

In the technique of the Patent Document 1, a potential of a precharge signal is obtained by using a boost voltage VPP at the same level as an activation level of a word line, whereby a load of a boost circuit is increased. Therefore, there arises the problem that power consumption of a boost circuit itself with poor voltage conversion efficiency is increased. In the technique of the Patent Document 2, the VDD is used as the potential of the precharge signal, so that there is the problem that an offset occurs in an input of a sense amplifier since an operation speed and equalize MOSFET are not provided. In the techniques of the Patent Documents 3 and 4, there is the problem that precharge and equalize operations of the bit line get late.

An object of the present invention is to provide a semiconductor integrated device provided with a memory circuit in which an operation is made high speed and power consumption is reduced. The above and other objects and novel features will become apparent from the description of this specification and the accompanying drawings.

Outlines of representative ones of inventions disclosed in the present application will be briefly described as follows. That is, there is provided the semiconductor integrated circuit device in which: a pair of precharge MOSFETs for supplying a precharge voltage to a pair of input/output nodes of a sense amplifier having a CMOS latch circuit is provided; a selection switch MOSFET is provided on the pair of input/output nodes to be selectively connected to a complementary bit-line pair, and a first equalize MOSFET is provided between the complementary bit-line pair for short-circuiting them during a precharge period; a dynamic memory cell provided between one of the complementary bit-line pair and a word line intersecting with it and comprising an address selection MOSFET and a storage capacitor is provided; a gate insulator of each of the selection switch MOSFET and the first equalize MOSFET is made from a first film-thickness gate insulator; a gate insulator of the precharge MOSFET is made from a second film-thickness gate insulator thinner than the first film-thickness gate insulator; a precharge signal corresponding to a power supply voltage is supplied to the precharge MOSFET; and an equalize signal and a selection signal corresponding to a boost voltage equal to or higher than the power supply voltage are supplied to the first equalize MOSFET and the selection switch MOSFET, respectively.

DESCRIPTION OF THE PREFERRED EMBODIMENTS

Figure 1:
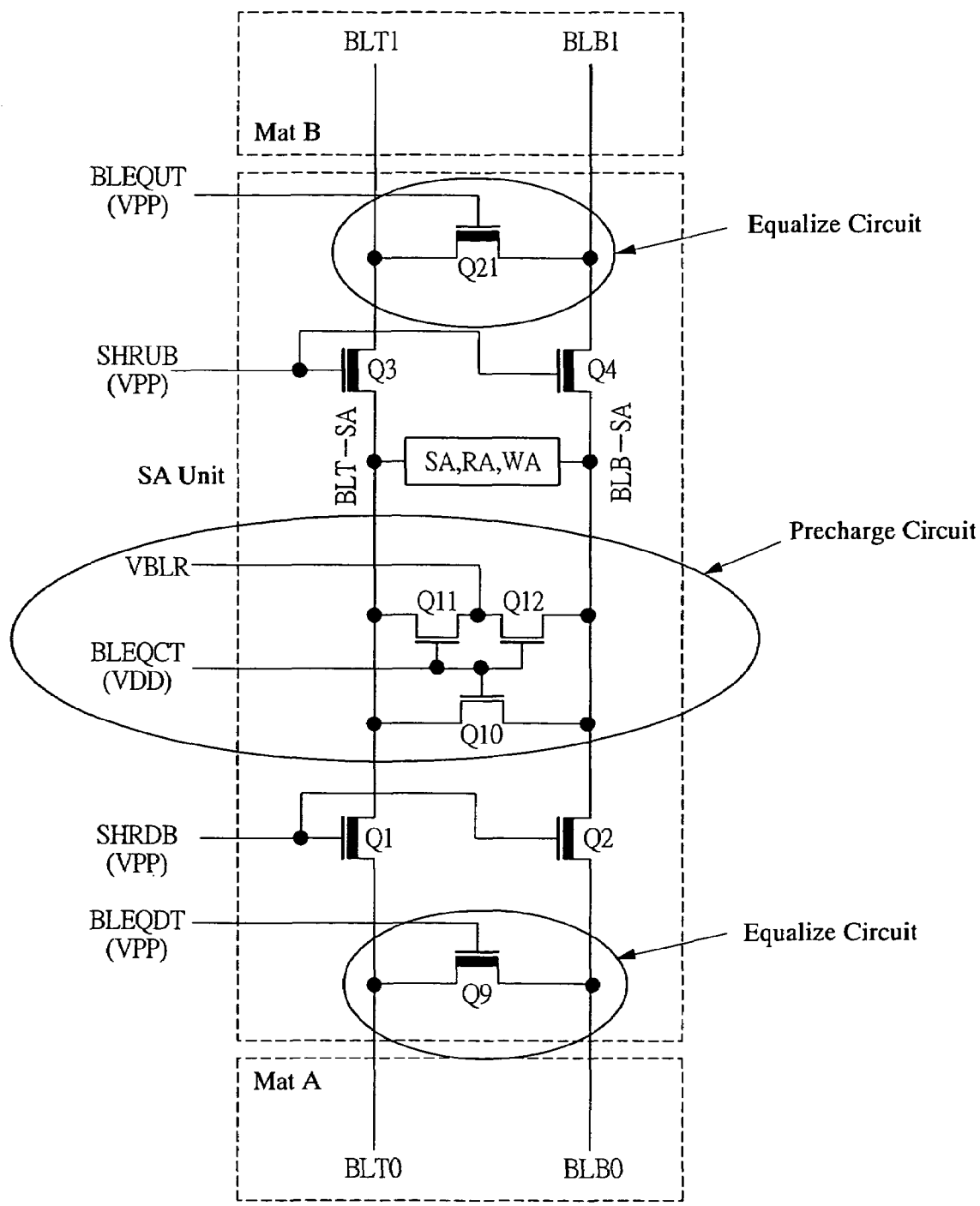
FIG. 1 is a circuit diagram showing a principal portion of an embodiment of a sense amplifier unit in a dynamic RAM according to the present invention.

In FIG. 1, a circuit diagram of a principal portion showing an embodiment of a sense amplifier unit in a dynamic RAM according to the present invention is shown. In this Figure, a circuit provided at a pair of input/output nodes of a sense amplifier SA, which is shown in a black box, is illustrated. Mats A and B are disposed on both sides of the sense amplifier unit shown by dotted lines in a bit-line direction. The mats A and B are used as sub arrays as described below. The sense amplifier SA in this embodiment is a shared sense amplifier type in which the two mats A and B are selectively used. Selection switch MOSFETs Q1, Q2 and Q3, Q4 in the sense amplifier SA are provided between complementary bit lines BLT0, BLB0 in the mat A and complementary bit lines BLT1, BLB1 in the mat B. Precharge MOSFETs Q11, Q12 and an equalize MOSFET Q10, which serve as a precharge circuit, are used as an inside circuit of the selection switch MOSFETs Q1 to Q4. The precharge MOSFETs Q11 and Q12 are arranged to transmit a precharge voltage VBLR, which corresponds to ½ of a power supply voltage VDD, to corresponding input/output nodes. The equalize MOSFET Q10 short-circuits a pair of input/output nodes. The inside circuit is provided with a read amplifier RA and a write amplifier WA, which are shown in the black box in the Figure, in addition to the sense amplifier SA. Furthermore, equalize MOSFETs Q9 and Q21 for short-circuiting the complementary bit lines BLT0 and BLB0 on a side of the mat A and the complementary bit lines BLT1 and BLB1 on a side of the mat B are provided as outside circuits of the selection switch MOSFETs Q1 to Q4, i.e., as equalize circuits, respectively.

In this embodiment, each gate insulator of the MOSFETs Q10 to Q12 is formed to be thin. A timing signal BLEQCT supplied to gates of the MOSFETs Q10 to Q12 is a low-amplitude signal such as the power supply voltage VDD corresponding to the operating voltage of the sense amplifier SA. In contrast, gate insulators of the selection switch MOSFETs Q1 to Q4 and the equalize MOSFETs Q9 and Q21 are formed to be thick. Timing signals BLEQUT and BLEQDT supplied to the gates of the MOSFETs Q9 and Q21 are high-amplitude signals such as a boost voltage VPP. Although being not illustrated, shared selection timing signals supplied to the gates of the selection switch MOSFETs Q1 to Q4 are also high-amplitude signals such as the boost voltage VPP. The word "T" of the reference symbol of the complementary bit line BLT stands for True, and "B" of the reference symbol "BLB" stands for Bar.

Figure 2:
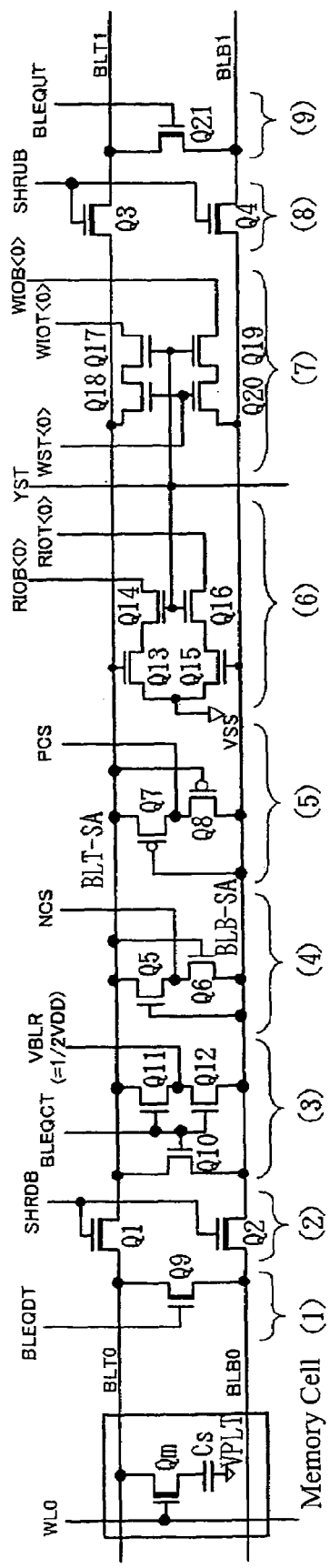
FIG. 2 is a circuit diagram showing a principal portion of an embodiment of the sense amplifier unit in the dynamic RAM according to the present invention.

In FIG. 2, a circuit diagram of an embodiment of the sense amplifier unit in the dynamic RAM according to the present invention is shown. In this Figure, one word line WL0 and two pairs of complementary bit lines BLT0, BLB0 and BLT1, BLB1 are illustrated as an representative example, and further the sense amplifiers SA, precharge circuits, equalize circuits, a read amplifier RA, and a write amplifier WA, etc., which are associated with the above lines, are illustrated as an representative example. In this Figure, a MOSFET, whose gate portion is illustrated by adding the symbol "o" (circle) that means an inversion, is a P-channel type and is distinguished from an N-channel MOSFET by the symbol.

A dynamic memory cell is composed of an address selecting MOSFET Qm and an information storage capacitor Cs. A gate of the address selecting MOSFET Qm is connected to the word line WL0, and one of source and drain of the MOSFET Qm is connected to the bit line BLT0. The other of the source and drain thereof is connected to a storage node that is one end of the information storage capacitor Cs. An electrode that is the other end of the information storage capacitor Cs is used as a common one, to which a plate voltage VPLT is applied. When the word line WL0 adopts a divided word line (or hierarchical word line) architecture comprising a main word line and a sub word line as described later, it corresponds to the sub word line.

The bit lines BLT0 and BLB0 are disposed in parallel with each other as shown in the Figure, and may be properly intersected in order to achieve, for example, a capacitance balance between the bit lines as occasion arises although being not particularly limited thereto. The above complementary bit lines BLT0 and BLB0 are connected to input/output nodes BLT-SA and BLB-SA of the sense amplifier by shared switch MOSFETs Q1 and Q2. A unit circuit constituting the sense amplifier is compose of a CMOS latch circuit having N-channel MOSFETs Q5, Q6 and P-channel MOSFETs Q7, Q8, whose respective gates and drains are cross-connected so as to obtain a latch configuration. Sources of the N-channel MOSFETs Q5 and Q6 are connected to a common source line NCS. Sources of the P-channel MOSFETs Q7 and Q8 are connected to a common source line PCS. The common source lines NCS and PCS are commonly connected to the sources of the same P-channel MOSFETs and N-channel MOSFETs as those described above in other CMOS latch circuits identical to those described above.

The power supply voltage VDD is supplied as an operating voltage to the common source line PCS through a P-channel power switch MOSFET provided in an intersection or cross area as described later. Similarly thereto, an N-channel power switch MOSFET provided in the intersection or cross area is provided to the common source line NCS corresponding to the N-channel MOSFETs Q5, Q6, and a ground potential GND is supplied to the common source line NCS.

A precharge circuit, comprising switch MOSFETs Q11, Q12 for supplying half precharge voltages VBLR (=VDD/2) to the complementary bit lines BLT0, BLB0 and BLT1, BLB1, are provided to the input/output nodes BLT-SA and BLB-SA of the sense amplifier. In addition, an equalize MOSFET Q10 for short-circuiting the input/output nodes BLT-SA and BLB-SA are provided although being not particularly limited thereto. A precharge (and equalize) signal BLEQCT is commonly supplied to gates of the MOSFETs Q10 to Q12. The signal BLEQCT has a signal amplitude corresponding to that of the above-described power supply voltage VDD. Note that although being not illustrated, the precharge circuit, comprising the equalize MOSFET for short-circuiting the common source lines NCS and PCS and the precharge MOSFET for supplying the half precharge voltage VBLR, is provided also on the common source lines NCS and PCS of the sense amplifier. These precharge circuits are provided in the intersection or cross area.

A direct sense amplifier RA constituting a read-type circuit and a write amplifier WA constituting a write-type circuit are provided in the input/output nodes BLT-SA and BLB-SA of the sense amplifier. The direct sense amplifier RA comprises N-channel MOSFETs Q13 to Q16. The write amplifier WA comprises N-channel MOSFETs Q17 to Q20. In the direct sense amplifier RA, gates of the amplifier MOSFETs Q13 and Q15 are connected in series to the input/output nodes BLT-SA and BLB-SA of the sense amplifier, respectively, and the MOSFETs Q14 and Q16, whose gates are connected to a column selection line YST, are serially connected to the amplifier MOSFETs Q13 and Q15, respectively. A drain of the MOSFET Q14 serving as a column switch is connected to a complementary read signal line RIOB <0>, and the MOSFET Q16 is connected to a read signal line RIOT <0>. A ground potential of the circuit is supplied to each sources of the amplifier MOSFETs Q13 and Q15.

In the write amplifier WA, the MOSFETs Q17 and Q18 and the MOSFETs Q19 and Q20 are connected in series to the input/output nodes BLT-SA and BLB-SA of the sense amplifier SA and complementary write signal lines WIOT <0> and WIOB <0>, respectively. The gates of the MOSFETs Q17 and Q19 serving as column selecting switches are connected to the column selection line YST. The gates of the MOSFETs Q18 and Q20 are connected to an operation timing signal line WST <0>.

The sense amplifier SA of this embodiment is a so-called shared sense amplifier in which two pairs of complementary bit lines BLT0, BLB0 and BLT1, BLB1 are provided above and below (left and right) with respect to the input/output nodes BLT-SA and BLB-SA. That is, the input/output nodes BLT-SA and BLB-SA are connected to the left-side bit lines BLT0 and BLB0 via the shared switch MOSFETs Q1 and Q2 and connected to the right-side bit lines BLT1 and BLB1 via the shared switch MOSFETs Q3 and Q4, respectively. Selection signals SHRDM and SHRUB are applied to the gates of the shared switch MOSFETs Q1, Q2 and Q3, Q4, respectively and each selection level of the selection signals SHRDB and SHRUB is set to a high level such as the boost voltage VPP having the same level as a selection level of, for example, the word line WL0. Therefore, the shared switch MOSFETs Q1 to Q4 are each made of the same thick gate insulator as that of the address selecting MOSFET Qm of the dynamic memory cell so as to have a high threshold voltage. Since the MOSFET Qm has a high threshold voltage, a leakage current in an off state is reduced and a retention time of stored information is extended.

When a memory mat on a downside (D) of the sense amplifier is selected, the MOSFETs Q1 and Q2 are kept in an on state by the selection signal SHRDB and the selection signal SHRUB is made a low level, whereby the bit lines BLT1 and BLB1 in a memory mat on an upside (U) are isolated. When the memory mat on the upside is selected, the MOSFETs Q3 and Q4 are kept in the on state by the selection signal SHRUB and the selection signal SHRDB is made a low level, whereby the bit lines BLT0 and BLB0 in the memory mat on the downside are isolated. Both the selection signals SHRDB and SHRUB are in high levels during a precharge period during which a memory access is finished. During the precharge period, the precharge signal BLEQCT and the equalize signals BLEQDT and BLEQUT are also made the high levels, whereby the precharge of the input/output nodes BLT-SA and BLB-SA and both the bit lines BLT0, BLB0 and BLT1, BLB1 are made.

In FIG. 2, the disposition of the respective MOSFETs is shown so as to correspond to those of the MOSFETs on a semiconductor substrate. That is, the equalize MOSFET Q9 provided on the complementary bit lines BLT0 and BLB0 corresponding to the memory mat on the downside (D) is disposed at a location (1) adjacent to the memory mat. The shared switch MOSFETs Q1 and Q2 are disposed at a location (2) adjacent to the above mentioned location (1) on sides of the input/output nodes BLT-SA and BLB-SA. The equalize MOSFET Q10 and the precharge MOSFETs Q11 and Q12 are disposed at a location (3) adjacent to the above-mentioned location (2). The N-channel MOSFETs Q5 and Q6 constituting the sense amplifier are disposed at a location (4) adjacent to the above-mentioned location (3). The P-channel MOSFETs Q7 and Q8 constituting the sense amplifier are disposed at a location (5) adjacent to the above-mentioned location (4). The MOSFETs Q13 to Q16 constituting the read amplifier RA are disposed at a location (6) adjacent to the above-mentioned location (5). The MOSFETs Q17 to Q20 constituting the write amplifier WA are disposed at a location (7) adjacent to the above-mentioned location (6). The shared switch MOSFETs Q3 and Q4 for connecting the complementary bit lines BLT1 and BLB1 corresponding to the memory mat on the upside (U) are disposed at an end portion (8) opposite to the input/output nodes BLT-SA and BLB-SA. An equalize MOSFET Q21 corresponding to the complementary bit lines BLT1 and BLB1 in the memory mat on the upside (D) is provided at a location (9) adjacent to the above-described end portion (8).

Figure 3:
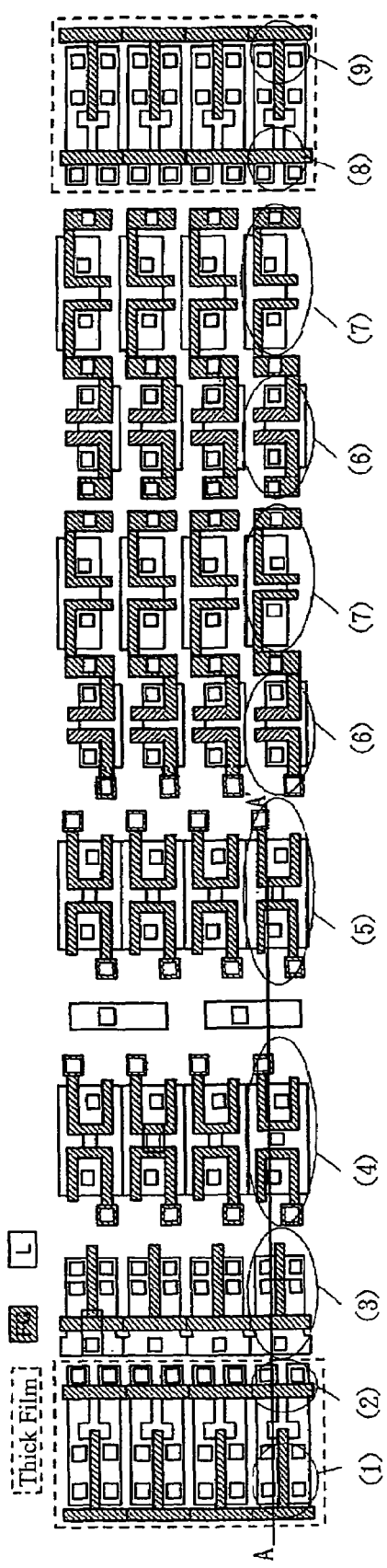
FIG. 3 is a partial layout diagram showing an embodiment of each MOSFET of FIG. 2.

In FIG. 3, a partial layout diagram of an embodiment of the MOSFETs in FIG. 2 is shown. In this Figure, patterns of L layers (source and drain diffusion layers) and FG layers (gate electrodes) of the MOSFETs are shown as an example. The FG layer is shaded by oblique lines, thereby being distinguished from the L layer. Contact portions are each represented by the symbol " " (rectangle) in the L layer of the source and drain and in the FG layer of the gate electrode.

In this embodiment, in order to make the substantial precharge operations of the bit lines BLT and BLB high speed and reduce the power consumption thereof, the equalize MOSFET Q9 (1) and the shared switch MOSFETs Q1 and Q2 (2) are provided on the bit lines BLT0 and BLB0 on the downside (D). Similarly, the equalize MOSFET Q21 (9) and the shared switch MOSFETs Q3 and Q4 (8) are provided on the bit lines BLT1 and BLB1 on the upside (U). Both ends of the sense amplifier are composed of MOSFETs, each of which having a gate insulator made from a thick film, as shown by the dotted lines. In addition, so as to correspond to the input/output nodes BLT-SA and BLB-SA interposed between the above mentioned (2) and (8), the precharge and equalize MOSFETs Q10 to Q12 (3), the N-channel MOSFETs Q5 and Q6 (4) of the sense amplifier, the P-channel MOSFETs Q7 and Q8 (5) of the sense amplifier, and pairs of MOSFETs (6), (7) and (6), (7) constituting the MOSFETs Q13 to Q16 of the read amplifier RA and the MOSFETs Q17 to Q20 of the write amplifier WA, which are composed of gate insulators made from thin films, are disposed. One of the two MOSFETs is used for selecting a column address.

Figure 4:
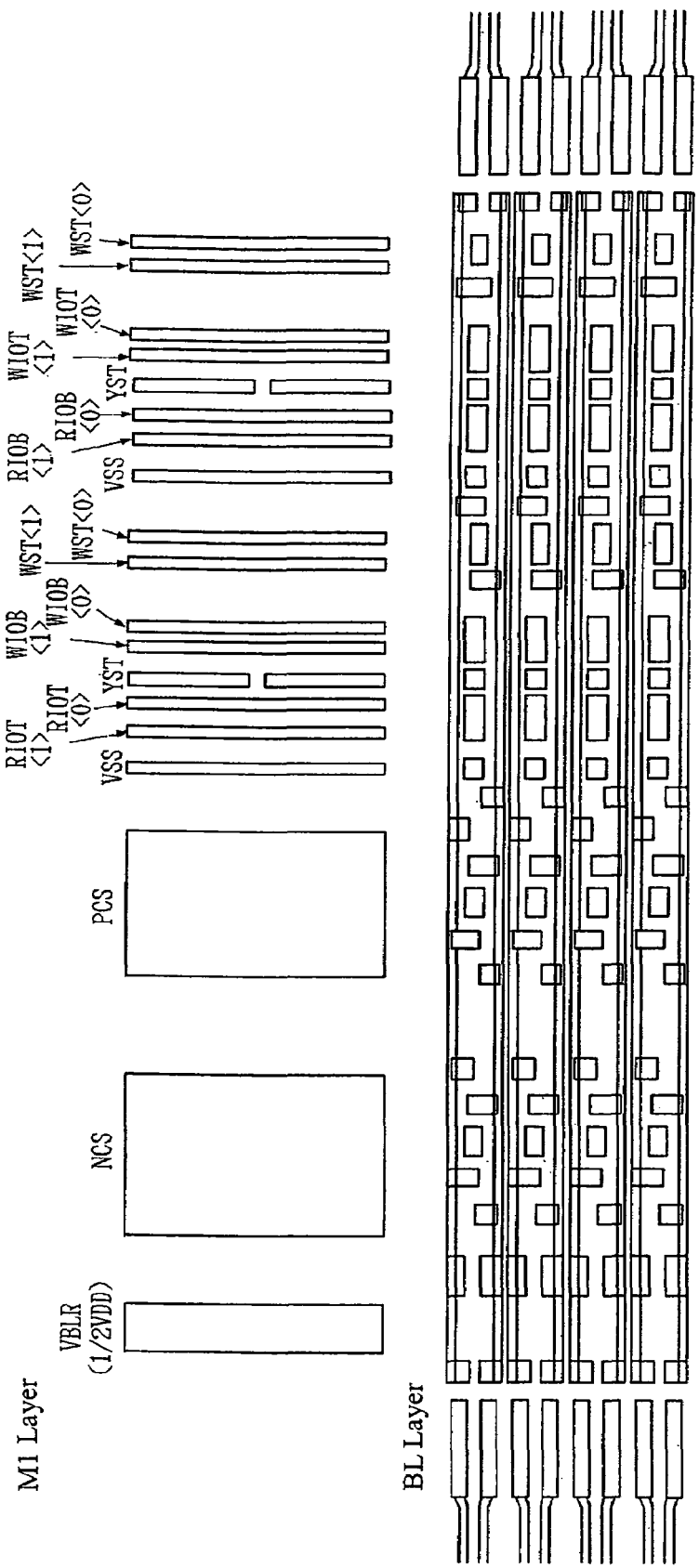
FIG. 4 is a partial layout diagram showing a principal portion of another embodiment of each MOSFET in FIG. 2.

In FIG. 4, another partial layout diagram of the embodiment of the respective MOSFETs of FIG. 2 is shown. The layout (wiring pattern) of a BL layer is shown in the right side of the Figure, and the layout (wiring pattern) of an M1 layer formed thereon is shown in the left side. The BL and M1 layers overlap with the L and FG layers of FIG. 3, whereby a circuit as shown in FIG. 2 is formed. The BL layer constitutes, in a memory array portion, the bit lines BLT0, BLB0, BLT1, and BLB1. That is, a pair of source and drain semiconductor layer constituting the equalize MOSFET Q9 and Q21 of the above-mentioned (1), between which the above gate electrodes are sandwiched, are connected to contacts each represented by the symbol " ". The BL layers corresponding to the complementary bit lines are used for wirings of the input/output nodes BLT-SA and BLB-SA at a center portion thereof.

The M1 layer on a left-half side of FIG. 4 is a metal wiring layer serving as a first layer, and is made of, for example, aluminum etc. The M1 layer is formed so as to extend in a direction perpendicular to the BL layer, i.e., in parallel with the word line and the gate electrodes of the equalize MOSFETs. In this Figure, respective names of the signals transmitted to the FG and M1 layers are denoted. For example, VBLR ($\frac{1}{2}$ VDD) is a wiring for supplying the precharge voltage given to the precharge MOSFETs Q11 and Q12, NCS is a common source line to the N-channel MOSFETs Q5 and Q6 constituting the sense amplifier, and PCS is a common source line to the P-channel MOSFETs Q7 and Q8 constituting the sense amplifier. Grounding wires VSS, timing signals, and signal lines required for operating the read amplifier RA and the write amplifier are sequentially disposed at VSS, RIOT <1>, RIOT <0>, YST, WIOT <1>, WIOT <0>, WST <1>, WST <0>, VSS, RIOB <1>, RIOB <0>, YST, WIOB <1>, WIOB <0>, WST <1>, and WST <0> in this order. Two pairs of adjacent complementary bit lines may be selected by one column selecting signal YST at the same time although being not particularly limited thereto, and are connected to two pairs of input/output lines RIOT <0> and <1>, RIOB <0> and <1>, and WIOT <0> and <1>, WIOB <0> and <1> in a write mode.

Figure 5:
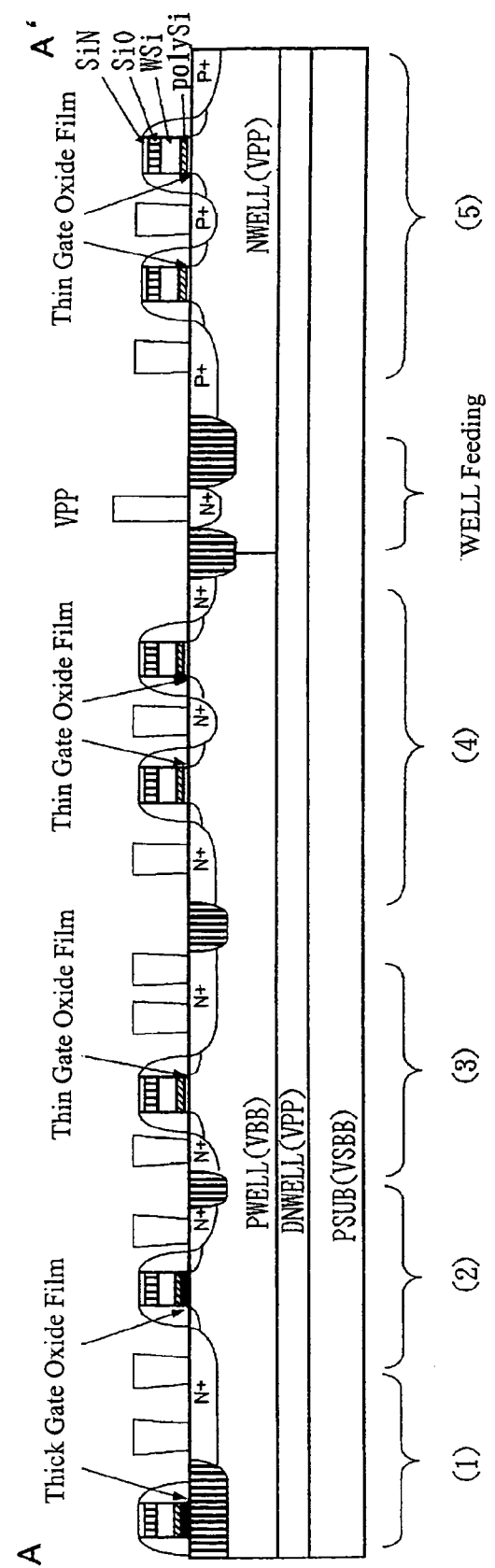
FIG. 5 is a cross-sectional view of a device that is an embodiment taken along line A–A' in FIG. 3.

In FIG. 5, a cross-sectional view of a device that is an embodiment taken along line A–A' in FIG. 3 is shown. In the Figure, a device pattern shown in FIG. 3 and a cross-sectional structure corresponding thereto are shown. That is, each cross-sectional view of the devices corresponding to the (1) to (5) shown in FIG. 2 is shown. The above-mentioned (1) corresponds to the equalize MOSFET Q9 of the complementary bit lines BLT0 and BLB0, of which gate insulator is made from a thick gate oxide film. Similarly, the gate insulators of the shared switch MOSFETs Q1 and Q2 of the (2) are also made from thick gate oxide films identical to that of the address selecting MOSFET Qm of the memory cell unshown. Thus, in the sense amplifier unit, the equalize MOSFET Q9 (Q21) of the bit lines BLT0, BLB0 and the shared switch MOSFETs Q1 and Q2 (Q3 and Q4) employ thick gate oxide films, and other MOS transistors employ thin gate oxide films. Since the equalize MOSFETs Q9 and Q21 are directly provided on the complementary bit lines BLT0, BLB0 and BLT1, BLB1, the precharge by short-circuiting the bit lines BL can be made at a high speed.

When the sense amplifier SA operates with respect to the downside bit-line pair (or upside bit-line pair) in the above-described manner, the shared selection signal SHRUB (or SHRDB) is fallen and the irrelevant upside bit-line pair (or downside bit-line pair) is isolated in terms of the circuit. As a result, the sense amplifier circuit unit becomes effective only for the bit-line pair to be an object. Namely, the sense amplifier circuit unit in the upper and lower shared switch MOSFETs can be used in common for both the upper and lower bit-line pairs, thereby being effective in space saving.

Figure 6:
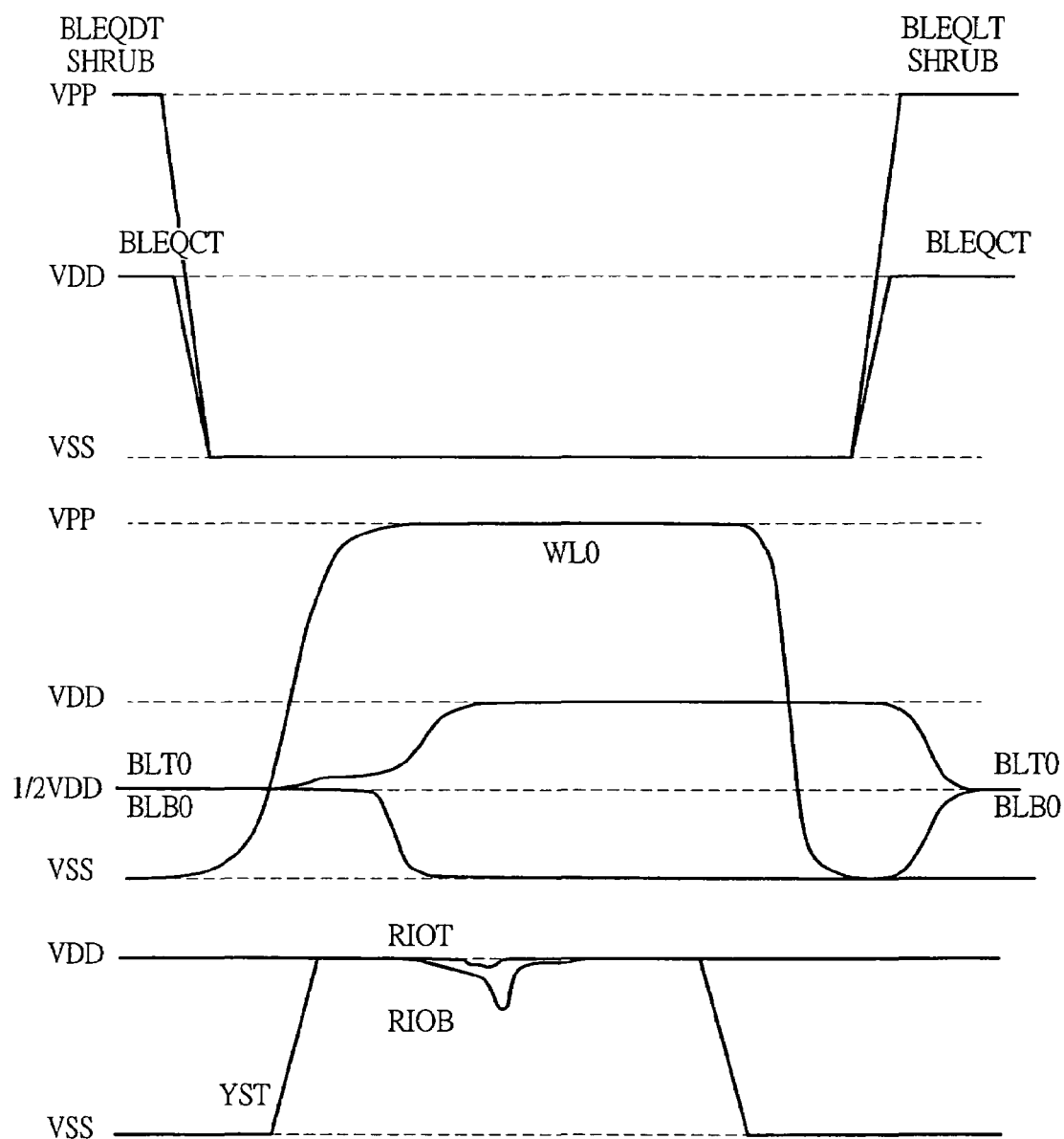
FIG. 6 is a timing diagram for explaining one example of an operation of a circuit used in FIG. 2.

In FIG. 6, a timing diagram for explaining an example of an operation of a circuit that is the embodiment of FIG. 2 is shown. By the above-described operation of selecting a lower type one, the shared selection signal SHRUB on a unselected side varies from a high level such as that of the boost voltage VPP to a low level such as that of a ground potential of the circuit. For example, when the downside bit lines BLT0 and BLB0 are selected, the shared selection signal SHRUB is made a low level, whereby the bit lines BLT1 and BLB1 are isolated. Meanwhile, the precharge (equalize) signal BLEQCT varies from a high level such as that of the power supply voltage VDD to a low level. Thereby, the equalize MOSFET Q10 and the precharge MOSFETs Q11 and Q12 are made to be in the off states, and the input/output nodes BLT-SA and BLB-SA are made to be in high-impedance states.

The word line WL0 rises from a low level such as that of the ground potential VSS of the circuit to a high level such as that of the boost voltage VPP. By rising of the word line, one of the bit lines BLT0 and BLB0 on a selected side is varied to have a minute voltage corresponding to information charges in the selected memory cell. Almost at the same time as this, the column selection signal YST is made a high level, whereby the read amplifier RA is activated. The sense amplifier becomes in an operating state by a sense amplifier activating signal unshown, so that the bit lines BLT0 and BLB0 are amplified to the high level (VDD) and the low level (GND). The amplifier signals of the input/output nodes BLT-SA and BLB-SA are transmitted to the read signal lines RIOT and RIOB via the direct sense amplifier RA. The read signals of the read signal lines RIOT and RIOB are outputted through a main amplifier MA and an output circuit unshown.

Although being illustrated, the MOSFETs Q18 and Q20 of the write amplifier becomes in the on states so as to correspond to the write signal WST in the write operation, so that write signals transmitted to the write signal lines WIOT and WIOB are transmitted to the input/output nodes BLT-SA and BLB-SA. If the writes signal capable of inverting storage information in the memory cell are transmitted, the levels of the input/output nodes BLT-SA and BLB-SA are inverted and the sense amplifier amplifies them to form the high and low levels such as those of the power supply voltage VDD and GND and transmits them to the selected memory cell via the bit line BLT0 or BLB0.

In FIG. 6, after rewriting to the memory cell is finished, the potential on the word line is fallen, whereby the memory cell is isolated from the bit lines. Then, in preparation for a read/write operation of a subsequent cycle, the pair of bit lines BLT0 and BLB0, which have been amplified respectively to "H"=VDD (bit line voltage) and "L"=GND levels, have to be precharged to ½ VDD of the precharge voltage. In this embodiment, since the equalize MOSFET Q9 is disposed outside the shared switch MOSFETs Q1 and Q2, the substantial precharge by short-circuiting the bit lines can be carried out at a high speed without being influenced by an on-resistance of the shared switch MOSFETs Q1 and Q2.

Figure 7:
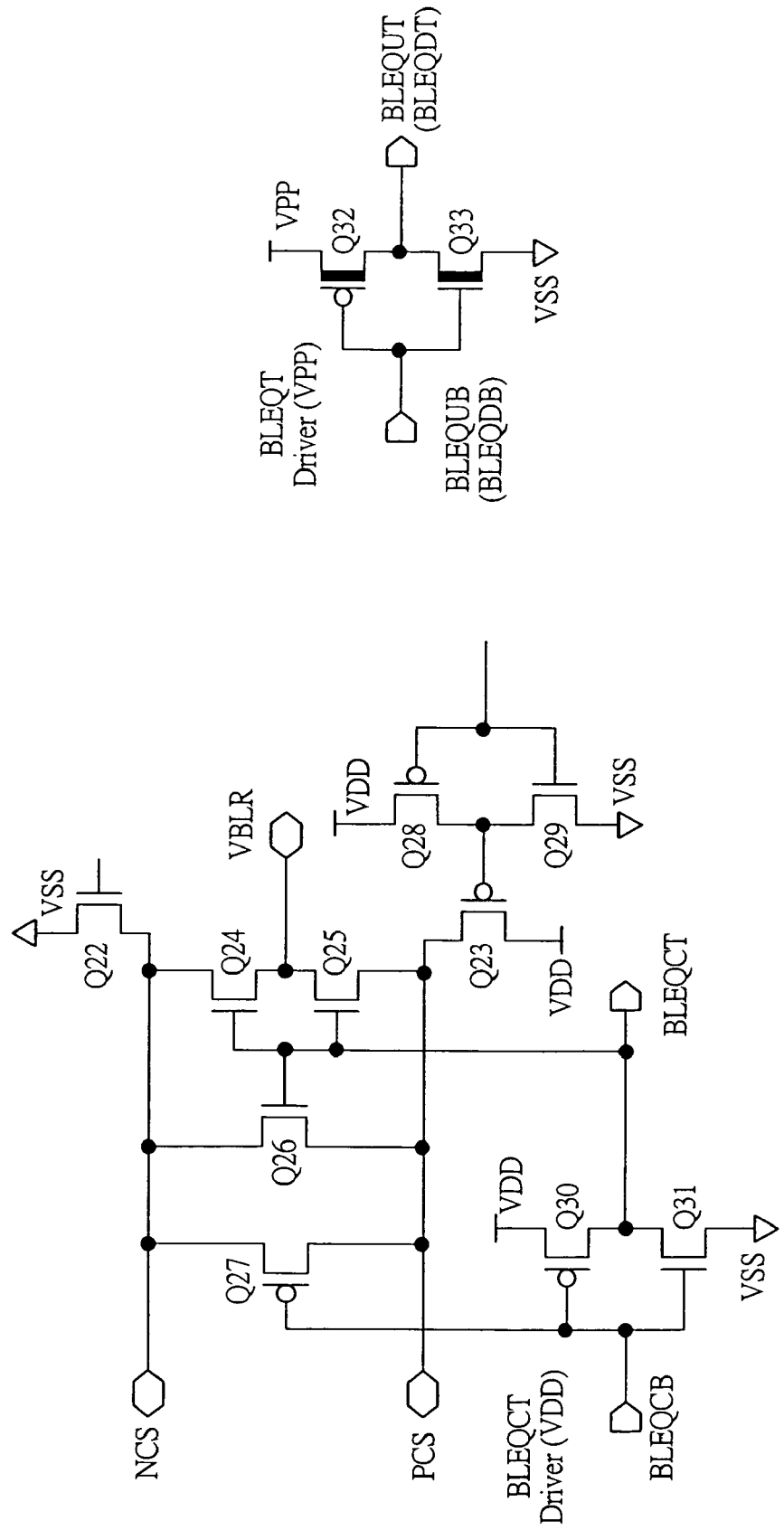
FIG. 7 is a circuit diagram showing an embodiment of a drive circuit unit for driving the sense amplifier unit in FIG. 2.

In FIG. 7, a circuit diagram showing an embodiment of a drive circuit portion for driving the sense amplifier unit of FIG. 2 is shown. In this Figure, a drive circuit for activating the sense amplifier, and a drive circuit for the shared switch MOSFETs and the equalize MOSFETs are shown as each representative example. These circuits are provided in the intersection or cross area as described later. An N-channel MOSFET Q22 constitutes a power switch for supplying the ground potential VSS of the circuit to the common source line NCS of the sense amplifier. A P-channel MOSFET Q23 constitutes a power switch for supplying the power supply voltage VDD to the common source line PCS of the sense amplifier. N-channel MOSFETs Q24 and Q25 for supplying a precharge voltage VBLR and an N-channel MOSFET Q26 for equalization are provided on the common source lines NCS and PCS. A precharge signal BLEQCT supplied to gates of the MOSFETs Q24 to Q26 is shared with the precharge signal BLEQCT supplied to the gates of the precharge MOSFETs Q11 and Q12 and the equalize MOSFET Q10 of the input/output nodes BLT-SA and BLB-SA in the sense amplifier SA, and generated by a CMOS inverter circuit comprising a P-channel MOSFET Q30 and an N-channel MOSFET Q31.

The CMOS inverter circuit operates by the power supply voltage VDD and outputs, as the above-described precharge signal BLEQCT, an inversion signal of the precharge signal BLEQCB. The common source lines NCS and PCS have a comparatively large parasitic capacitance since the sources and gates of the N-channel MOSFETs and the P-channel MOSFETs constituting the sense amplifier are provided thereto. By doing so, when the ground potential VSS of the common source line NCS and the power supply voltage VDD of the common source line PCS are short-circuited by the N-channel MOSFET Q26, it takes a long time until each common source line reaches to an equivalent level such as VDD/2. Therefore, a P-channel MOSFET Q27 is provided in parallel for equalization. The precharge signal BLEQCB on an input side is supplied to a gate of the MOSFET Q27. As a result, by using the comparatively low VDD, the precharge operation by equalization of the common source lines NCS and PCS can be performed at a high speed. In addition, since the above-described low voltage VDD is used for the precharge operation, a load imposed on a boost circuit for generating the boost voltage VPP is reduced, whereby the power consumed in the boost circuit is reduced. As described above, since the circuits are operated by the power supply voltage VDD, they are composed of MOSFETs made from thin gate insulators similarly to the sense amplifier.

A P-channel MOSFET Q32 and an N-channel MOSFET Q33 constitute a drive circuit for generating the equalize signal BLEQDT (BLEQUT) supplied to the gate of the equalize MOSFET Q9 (Q21) provided on, for example, the complementary bit lines BLT0 and BLB0 (BLT1 and BLB1). This drive circuit is a CMOS inverter circuit in which the boost voltage VPP serves as an operating voltage and the equalize signal BLEQDB (BLEQUB) is supplied to an input thereof. Thus, since operating by the boost voltage VPP, the MOSFETs Q32 and Q33 comprise MOSFETs made of the same thick gate insulators as those of the shared switch MOSFETs Q1 to Q4 and the equalize MOSFETs Q9 and Q21. Although being not illustrated, the drive circuit for generating the shared selection signals SHRDB and SHRUB is also provided in the intersection or cross area and composed of the same CMOS inverter circuit as that of the MOSFETs Q32 and Q33.

Figure 8:
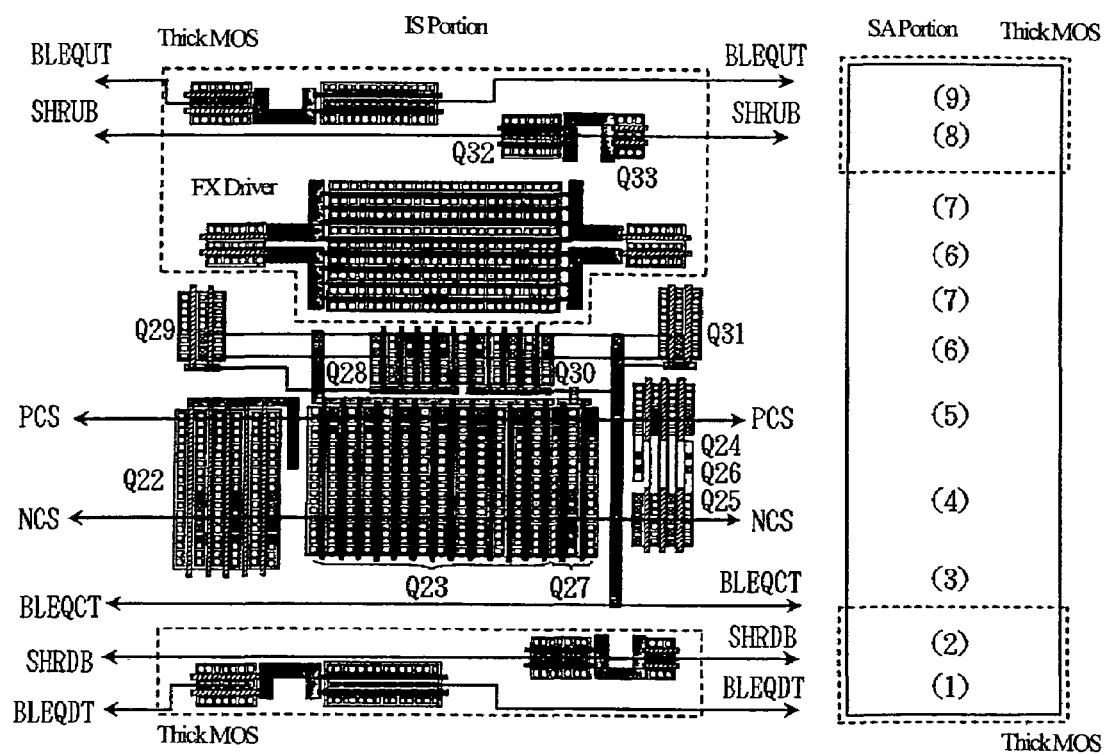
FIG. 8 is a layout diagram showing an embodiment of an intersection or cross-area portion.

In FIG. 8, a layout diagram of an embodiment of the intersection or cross area portion is shown. In this Figure, layout of MOSFETs as represented by the MOSFETs Q22 to Q33 in FIG. 7 is shown, and arrangement of the representative devices of the above-described (1) to (9) constituting the sense amplifier unit corresponding to the layout is also shown together. In a center of the intersection portion, the N-channel power switch MOSFET Q22 and the P-channel power switch MOSFET Q23 are disposed. The P-channel MOSFET Q27 for equalization is disposed to be adjacent to the P-channel MOSFET Q23. The N-channel MOSFETs Q24 to Q26 are provided to be adjacent to the P-channel MOSFET Q27.

On/Over a row of the MOSFETs Q22 to Q26, the N-channel MOSFET Q29, the P-channel MOSFETs Q28 and Q30, and the N-channel MOSFET Q31 constituting a CMOS inverter circuit are provided. In a lower end portion of the intersection under/below the row of the MOSFETs Q22 to Q26, a drive circuit for generating the shared selection signals and equalize signals is provided. In the upper end portion of the intersection, the drive circuit for generating the shared selection signals and equalize signals is provided in the form of inverting the lower end portion by mirror. In the circuits, the MOSFETs Q32 and Q33 are illustrated. Furthermore, two sets of FX drivers for generating sub word selection signals are provided below the drive circuit for generating the shared selection signals and equalize signals provided in the upper end potion of the intersection. In this Figure, since the MOSFETs surrounded by dotted lines belong to circuits operated by the boost voltage VPP, they are composed of MOSFETs made from thick gate insulators, and the other MOSFETs are composed of MOSFETs made from thin gate insulators.

In the sense amplifier unit disposed together with the above-described intersection portion, the MOSFETs (9), (8) and (2), (1), which are composed of MOSFETs made of thick gate insulators, are disposed on both of the upper and lower ends. The MOSFETs (3) to (7), which are composed of MOSFETs made of thin gate insulators, are disposed in the center. That is, the above-described (1) represents the equalize MOSFET Q9 of the complementary bit lines BLT0 and BLB0, and (2) represents the shared switch MOSFETs Q1 and Q2. The above-described (9) represents the equalize MOSFET Q21 of the complementary bit lines BLT1 and BLB1, and (8) represents the shared switch MOSFETs Q3 and Q4. Furthermore, the (3) represents the equalize and precharge MOSFETs Q10 to Q12 of the input/output nodes BLT-SA and BLB-SA, the (4) represents the N-channel MOSFETs Q5 and Q6 constituting the sense amplifier, the (5) represents the P-channel MOSFETs Q7 and Q8 constituting the sense amplifier, and the (6) and (7) represent the MOSFETs Q13 to Q16 and Q17 to Q20 constituting the read amplifier RA and the write amplifier, respectively.

In this embodiment, the equalize MOSFETs of the complementary bit lines are disposed outside the shared switch MOSFETs, and the precharge signal BLEQCT of the input/output nodes in the sense amplifier inside the shared switch MOSFETs is set to a level of VDD. Since the equalize MOSFETs on the complementary bit lines are disposed outside the shared switch MOSFETs, the substantial precharge of the complementary bit lines can be performed at a high speed without interposing the on-resistance of the shared switch MOSFETs. Since the precharge signal inside the shared switch MOSFETs in the sense amplifier unit reaches the VDD level, the power consumed in the boost circuit for generating the VPP voltage can be suppressed. Moreover, in accordance with a change of the precharge signals inside the shared switch MOSFETs from the VPP level to the VDD level, the precharge and equalize signals of the common source lines NCS and PCS in the sense amplifier are also made lower like the VDD level, so that the P-channel MOSFET is added as an equalize circuit to make the precharge operations of the common source lines NCS and PCS high speed without increasing the power consumption in the boost circuit.

In the layout of the sense amplifier unit and the intersection portion, the shared switch MOSFETs and the bit line equalize MOSFETs comprise MOSFETs made of thick gate insulators, and the precharge MOSFETs and the MOSFETs constituting the sense amplifier, the read amplifier, and the write amplifier disposed inside the shared switch MOSFETs are compose of MOSFETs made of thin gate insulators. Therefore, by regarding the shared switch MOSFET as a boundary, the MOSFETs made of the thick gate insulators and those made of the thin gate insulators are separated from one another. That is, the layout can be separated so that all the MOSFETs disposed outside including the shared switch MOSFETs are composed of MOSFETs made of thick gate insulators including the address selecting MOSFET constituting the memory cell and that all the MOSFETs disposed inside are composed of MOSFETs made of the thin gate insulators. In response to this, the intersection portion is also separated so as to correspond to the sense amplifier unit.

Figure 9:
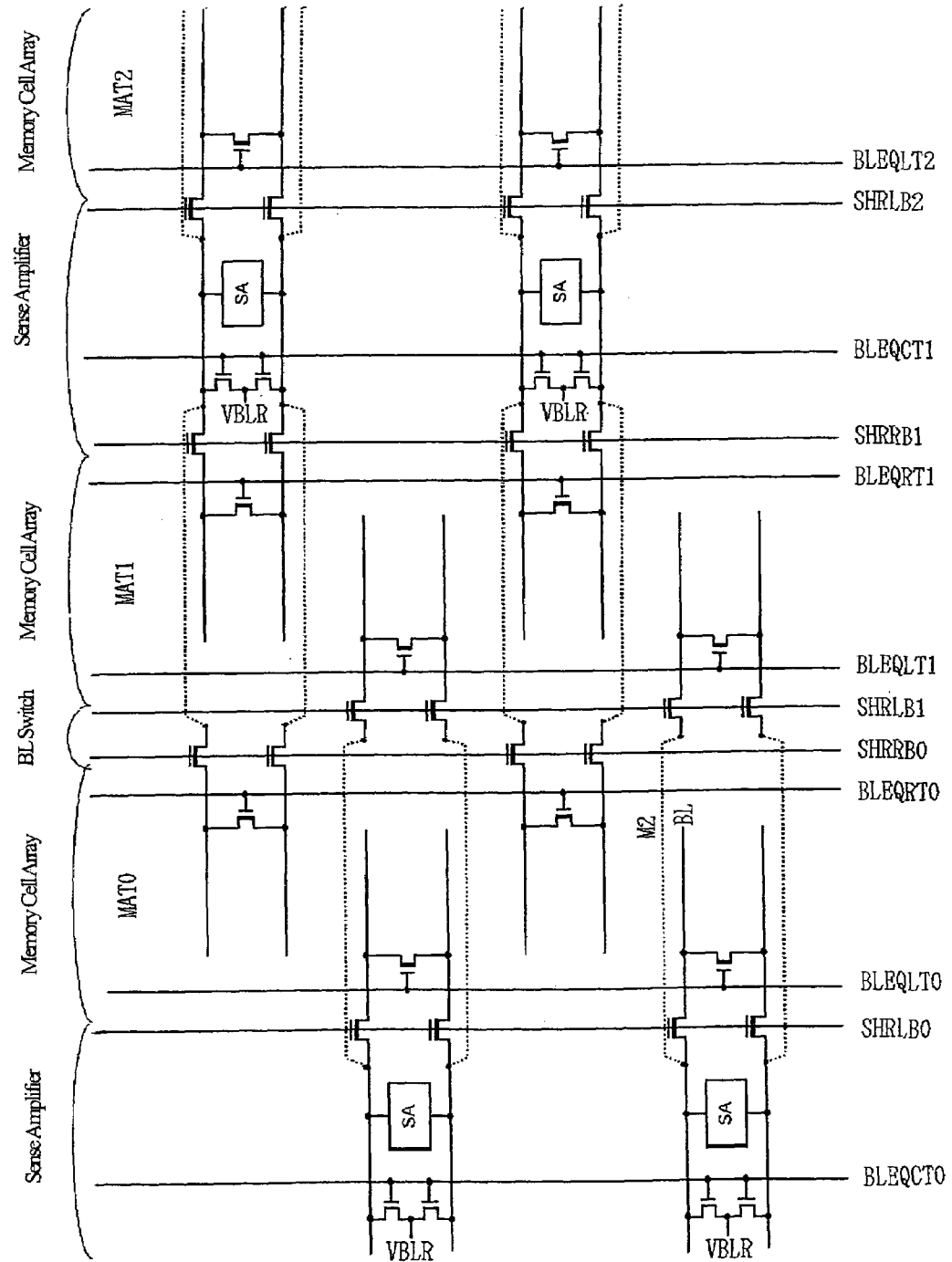
FIG. 9 is a circuit diagram of a principal portion showing an embodiment of a memory cell array portion in a dynamic RAM according to the present invention.

In FIG. 9, a circuit diagram showing a principal portion of an embodiment of a memory cell array portion in a dynamic RAM according to the present invention is shown. A bit line of this embodiment is a hierarchized bit line. That is, four pairs of complementary bit lines are provided in a bit-line extension direction by regarding the sense amplifiers SA as a center thereof. Two pairs of first and second complementary bit lines are disposed at both ends of sense amplifier circuit SA, respectively. Furthermore, on both sides of a far end viewed from a side of the sense amplifier circuit SA of the first and second complementary bit lines, third and fourth complementary bit lines are extended in the same direction as that of the first and second complementary bit lines. Thus, the third and fourth complementary bit lines provided at positions away from the sense amplifier circuit SA are connected to the input/output nodes of the sense amplifier circuit by an upper metal wiring (M2 wiring) shown by the dotted lines in the Figure. That is, in the input/output nodes of the sense amplifier circuit SA, upper portions of the first and second complementary bit lines are extended along them by an upper wiring layer shown by the dotted lines, shared selection MOSFETs are provided so as to be adjacent to the far end potions of the first and second complementary bit lines, and the third and fourth complementary bit lines are provided via the above MOSFETs.

The sense amplifier circuits SA are alternately disposed on both sides of a memory cell array composed of two pairs of complementary bit lines extending in the above-described same direction, and two columns of the complementary bit lines are disposed with respect to one sense amplifier circuit SA, whereby memory cells are disposed in the memory cell array with high density. That is, by regarding the memory cell array as a center, the sense amplifier circuits SA are alternately provided on both sides of the array, and half or two pairs of the four pairs of complementary bit lines connected to the sense amplifier SA are provided in the memory cell array. In a middle portion of the memory cell array in the bit-line direction, shared selection MOSFETs corresponding to the third and fourth complementary bit lines disposed at positions away from the sense amplifier circuit SA and an equalize MOSFET for performing a precharge operation are provided.

A plurality of memory cell arrays described above are provided in a bit-line extension direction and, except for the memory cell arrays provided at both ends, the sense amplifier circuits are used for amplifying the read signals of the two pairs of complementary bit lines in each of the memory cell arrays disposed on both sides of the sense amplifier circuit, i.e., of a total of four pairs of complementary bit lines. In FIG. 9, a memory mat MAT0 is a memory cell array at the left end, wherein the sense amplifiers SA provided on the left side thereof have only two pairs of hierarchized bit lines corresponding to the memory mat MAT0. Hierarchizing such bit lines is beneficial to a high-speed, large-capacitance array. That is, in order to reduce the load imposed on the bit lines, the number of bits connected to one bit line is smaller than that of a general purpose DRAM, namely, the number of memory cells (bit line length) is smaller. Accordingly, parasitic capacitance of the bit lines is reduced, a read signal potential difference corresponding to charges read from the memory cells is increased and the load imposed on the sense amplifiers is reduced, whereby a high-speed read operation can be performed.

In order to minimize a delay caused in precharging a sub mat at a far end of the sense amplifier circuit SA, the bit lines on the sub mat at the far end of the sense amplifier are connected to the sense amplifier circuit SA by a metal wiring M2 shown by the dotted lines, so that the capacitance (and resistance) of the sub mat is increased to a degree of having the metal wiring M2 in comparison with the sub mat near the sense amplifier. This leads to an increase in a time for amplifying the read signals of the bit lines and a precharge time. In order to prevent this, an equalize MOSFET is disposed at a bit-line switch portion. It is possible to obtain a circuit configuration not affected by the on-resistance of the shared switch MOSFETs during the precharge and to keep the precharge with a high speed. Further, as shown in the Figure, the precharge may be carried out by omitting the equalize circuit provided on the input/output nodes of the sense amplifier SA or only by the two precharge MOSFETs.

Figure 10:
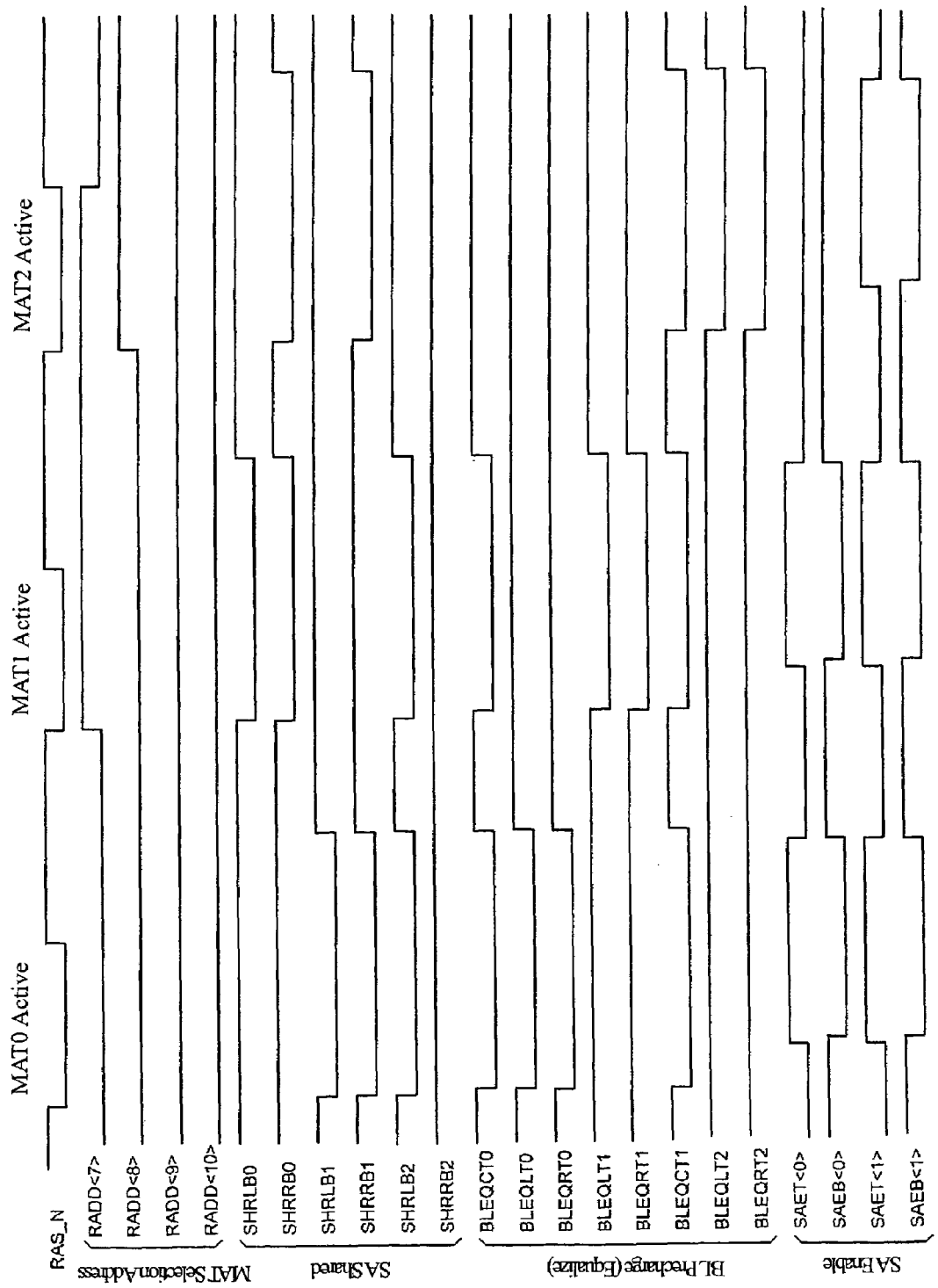
FIG. 10 is a timing diagram for explaining an example of an operation of the dynamic RAM shown in FIG. 9.

In FIG. 10, a timing diagram for explaining an operation example of the dynamic RAM shown in FIG. 9 is shown. In this Figure, an example of the case where memory mats MAT0, MAT1, and MAT2 are sequentially activated is shown. By using four bits of mat selection addresses RAD <7> to <10>, sixteen memory mats can be selected in total. Among those, three memory mats shown in above mentioned FIG. 9 are such that: if RADs <9> and <10> are in low levels and RADs <7> and <8> are also in low levels, the memory mat MAT0 is activated; if the RAD <7> is in a high level and the RAD <8> is in the low level, the memory mat MAT1 is activated; and if the RADs <7> and <8> are in the high levels, the memory mat MAT2 is activated.

When the memory mat MAT0 is activated, the sense amplifiers SA on both sides thereof are activated. In order to activate the sense amplifiers SA, an SA enable signal generates signals SAET <0>, SAEB <0>, SAET <1> and SAEB <1> for activating the sense amplifiers disposed on both sides of the memory mat MAT0. Herein, the SAET corresponds to the SAEN for making the N-channel MOSFET in the on state, and the SAEB corresponds to the SAEP for making the P-channel MOSFET in the on state.

In one of SA shared switch selection signals, signals SHRLB0 and SHRRB0 are kept in high levels so that the complementary bit lines of the memory mat MAT0 are connected to the input/output nodes of the sense amplifiers SA, and the others of the SA shared switch selection signals become in low levels, i.e., in unselected levels, so that the complementary bit lines corresponding thereto are isolated from the sense amplifier SA.

So as to correspond to a connection relation between the complementary bit lines and the sense amplifiers SA as described above, signals BLEQCT0 and BLEQCT1 of the precharge MOSFETs provided in the sense amplifier portions disposed on both sides of the memory mat MAT0 and signals BLEQLT0 and BLEQRT0 of the precharge MOSFETs for equalizing the complementary bit lines disposed in the memory mat MAT0 are made to be in low levels. Signals BLEQLT1, BLEQRT1, BLEQLT2, and BLEQRT2 of the precharge MOSFETs for equalizing the complementary bit lines disposed in the unselected memory mats MAT1 and MAT2 remain in the high levels.

According to an unshown end signal with low-type selection timing, the potential on the word line is made to be in an unselected level, the memory cells are isolated from the complementary bit lines, the SA enable signals are reset so that the sense amplifiers are in an non-operational state, the SA shared signals return to the high levels, the BL precharge (equalize) signals are generated, and the complementary bit lines having been made to be in the high/low levels by the amplification operations of the sense amplifiers SA are set to have half precharge voltages at a high speed by the on states of the equalize MOSFETs. The precharge MOSFET provided in the sense amplifier unit performs an operation of complementing a reduction of the precharge voltage having been generated by the above-described equalize operation, mainly due to a leakage current. Thereafter, if the memory mat MAT1 or/and MAT2 becomes active, a connection relation between the complementary bit lines and the sense amplifiers SA is correspondingly determined by the SA shared signals and the BL precharge signals and the sense amplifier corresponding to the memory mat to become activated is activated by the SA enable signal.

Figure 15:
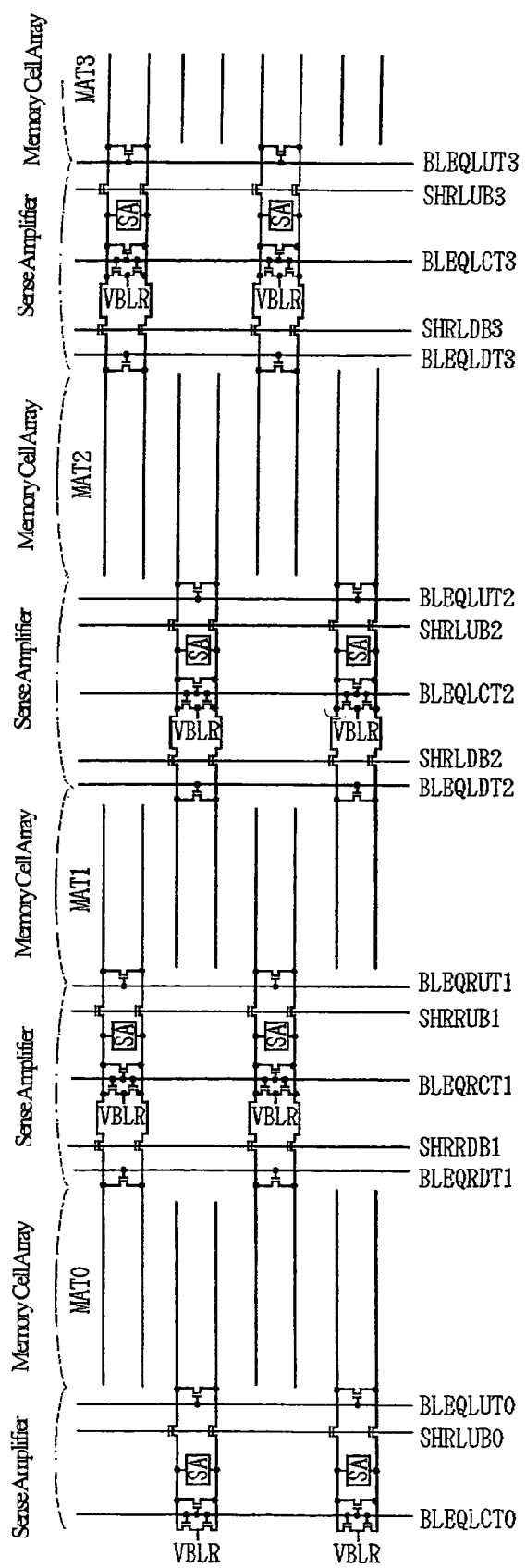
FIG. 15 is a circuit diagram of a principal portion showing another embodiment of the memory cell array portion in the dynamic RAM according to the present invention.

In FIG. 15, a circuit diagram of a principal portion of another embodiment of the memory cell array portion in the dynamic RAM according to the present invention is shown. A difference between the circuit diagram of the principal portion of FIG. 9 and that of this case is that the two pairs of complementary bit lines, which are not hierarchized, are provided in the bit-line extension direction by regarding the sense amplifier unit SA as a center. Since the bit lines are not hierarchized, the number of shared MOSFETs can be reduced to half, whereby an area thereof can be reduced. Also, since one layer can be removed from the wiring layers in comparison with the hierarchical bit-line structure, manufacture thereof can be achieved at low cost.

Figure 16:
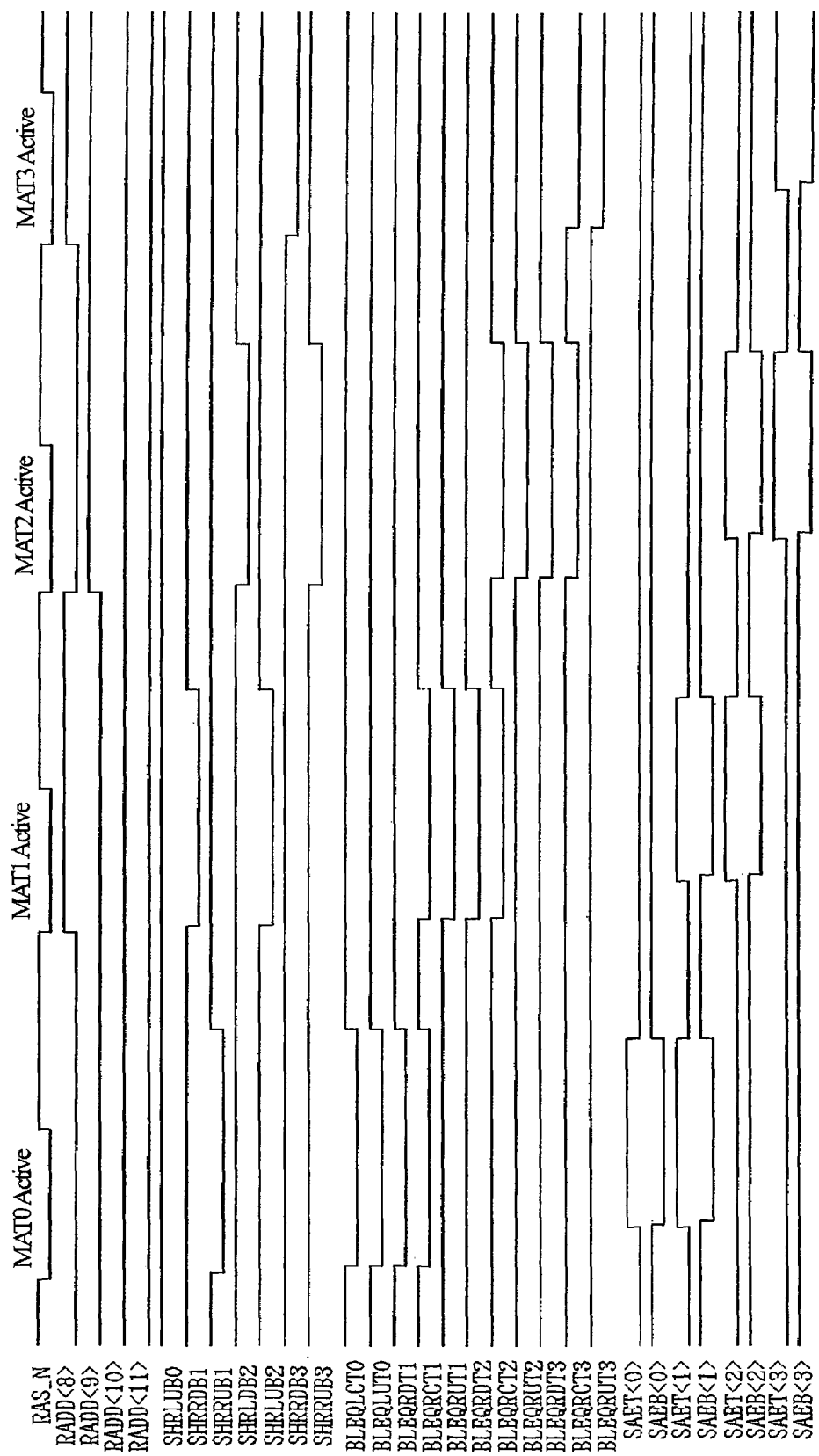
FIG. 16 is an operation waveform diagram for explaining an example of a circuit operation of FIG. 15.

FIG. 16 is an example of an operation waveform diagram of the circuit shown in FIG. 15. In FIG. 16, an example of the case where memory mats MAT0, MAT1, MAT2, and MAT3 are sequentially activated is shown. Similarly to the operation waveform diagram shown in FIG. 10, so as to correspond to the selected memory mat, the connection relation between the complementary bit lines and the sense amplifiers SA is determined by the SA shared signal and the BL precharge signal, and the sense amplifier corresponding to the memory mat to become activated is activated by the SA enable signal.

Figure 11:
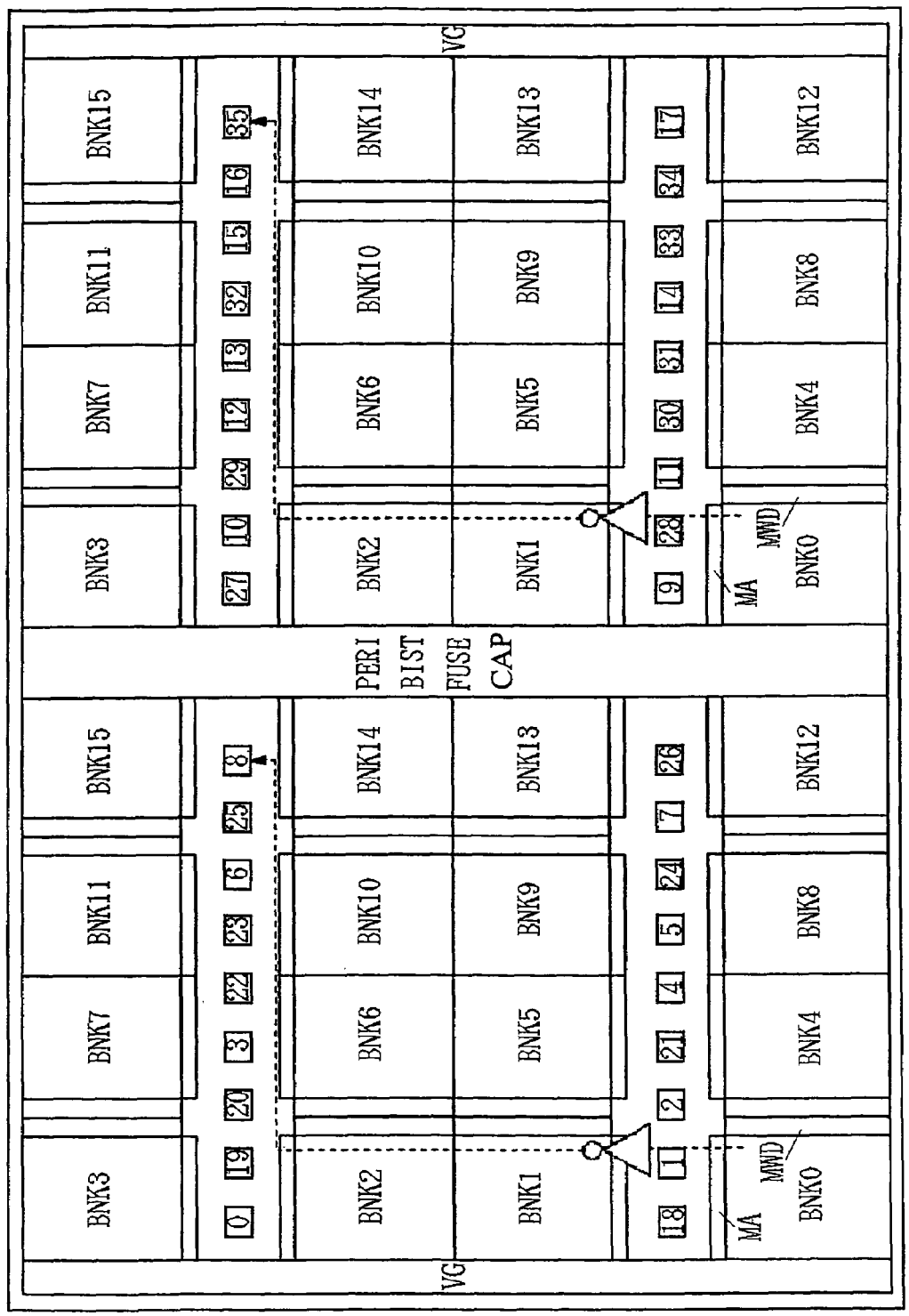
FIG. 11 is a schematic layout diagram showing an embodiment of the DRAM according to the present invention.

In FIG. 11, a schematic layout diagram of an embodiment of a DRAM according to the present invention is shown. In this Figure, each principal portion of the circuit blocks constituting the DRAM is shown to be understood easily, and is formed on a single semiconductor substrate such as that of single crystal silicon by a publicly known manufacturing technique of semiconductor integrated circuits. In this embodiment, a peripheral circuit portion represented by, e.g., a peripheral circuit PERI is provided at a center of a semiconductor chip in a longitudinal direction thereof, wherein the semiconductor chip is divided into two by the peripheral circuit portion. Memory banks BNK0 to BNK15 are provided on each of the two-divided semiconductor chips. That is, one memory bank BNK0 before division comprises two memory banks BNK0 disposed on both sides of the peripheral circuit portion after the division.

Each of the two-divided semiconductor chips with respect to the longitudinal direction of the semiconductor chip is divided in half in a transverse direction, whereby sixteen memory banks are divided into two groups, each of which has eight memory banks. In each of the two-divided semiconductor chips in the longitudinal direction of the semiconductor chip, sixteen memory banks BNK0 to 15 are provided so as to be arranged in, for example, 4×4. Four memory banks, e.g., BNK0, BNK4, BNK8, and BNK12 are aligned in the longitudinal direction of the semiconductor chip, and also four memory banks, e.g., BNK0, BNK1, BNK2, and BNK3, are aligned in the transverse direction thereof. Between the BNK0, BNK4, BNK8, BNK12 and the BNK1, BNK5, BNK9, BNK13 aligned in the longitudinal direction of one the two-divided semiconductor chips, data input/output pads are disposed so as to be aligned in the longitudinal direction. Also between BNK2, BNK6, BNK10, BNK14 and BNK3, BNK7, BNK11, BNK15 aligned in the longitudinal direction of the other thereof, data input/output pads are disposed so as to be aligned in the longitudinal direction. In other words, the semiconductor chip is divided into two in the transverse direction of the chip and, in each of the two-divided semiconductor regions, the data input/output pads are disposed at a center thereof so as to be aligned in the longitudinal direction and the four memory banks are disposed so as to be sandwiched between the above-mentioned data input/output pads.

Eighteen data input/output pads in the semiconductor chip as a whole are provided in two columns in the longitudinal direction. Thereby, writing and reading of data are executed on the DRAM of this embodiment in units of 36 bits. One of two-divided 18-bit data in the 36-bit data is allocated to each of the two-divided memory banks BNK0 to BNK15, wherefore the reading and writing can be performed in units of 36 bits as a whole.

In this embodiment, in addition to an input/output of data in units of 36 bits, development to products obtained by performing an input/output of data in units of 18 bits can be carried out by changing partially a mask as included in a bonding option etc. Therefore, the data input/output pad comprising pads 0 to 35 is not simply aligned in the above-described two columns but, by numbers denoted in the Figure, is such that the numbers 0 to 17 among the numbers 0 to 35, i.e., 18 bits, are sorted into two groups of, for example, the numbers 0 to 8 and 9 to 17 in lower and upper half areas of the Figure, respectively, and the numbers 18 to 35 corresponding to 18 bits are sorted into two groups of, for example, the numbers 18 to 26 and 27 to 35 in the lower and upper half areas of the Figure, respectively.

In the lower half area of the Figure, the data input/output pads with the numbers 0 to 8 are disposed so as to be sorted into two columns of data input/output pads in the left and right of the Figure. For example, the numbers 0, 3, 6, and 8 corresponding to 4 bits are disposed in a left column, and the numbers 1, 2, 4, 5, and 7 corresponding to 5 bits are disposed in a right column. In the upper half area of the Figure, the data input/output pads with the numbers 9 to 17 are disposed so as to be sorted into two columns of data input/output pads in the left and right of the Figure. For example, the numbers 10, 12, 13, 15, and 16 corresponding to 5 bits are disposed in a left column, and the numbers 9, 11, 14, and 17 corresponding to 4 bits are disposed in the right column. Thus, if products have 18-bit configurations, the data output circuits provided so as to correspond to the data input/output pads 0 to 17 operate dispersedly on the semiconductor chip, as described above. For this reason, it is possible to avoid the problem that noise involved in an operation of a data output buffer is concentrated on a specific location and thereby operation margins of the memory banks provided near the location degenerate.

In this embodiment, when attention is paid on, for example, the memory bank BNK0, the longest signal transfer path is formed by signal paths shown by the dotted lines in the Figure. That is, with regard to the respective data input/output pads 8 and 35, signal paths from the two memory banks BNK0 having been divided into the upper and lower areas of the Figure to the pads 8 and 35 are formed, respectively, whereby the length of each path can be about ½ shorter than that of the case where the memory banks are not divided into two. For example, if the memory banks are not divided into two on the upper and lower sides of the semiconductor chip, one memory bank before the division is formed by, for example, the memory bank BNK0 on the lower side and the memory bank BNK4 adjacent thereto. At this time, a signal transfer path from the one memory bank to the pad 35 provided at a chip end opposite to the one memory bank becomes about twice shorter in length than that shown by the dotted lines. In the Figure, the inverter circuit represents an amplifier circuit on the above-described signal transfer path.

In FIG. 11, in each of the memory banks BNK0 to BNK15, a main word decoder portion MWD and a main amplifier portion MA are provided in a peripheral portion thereof. Thus, each memory bank is independent as one memory circuit, thereby being able to make a memory access. The peripheral circuit portion dividing the memory banks BNK0 to BNK15 into two are provided with a BIST (test circuit), a FUSE (redundant fuse), and a CAP (capacitor for stabilizing power supply) in addition to the peripheral circuit PERI such as an address buffer and a control circuit. Correspondingly, pads corresponding to an address terminal and a control terminal are disposed so as to be aligned in the transverse direction. Furthermore, power supply circuits VG are provided on both sides of the chip extending in the longitudinal direction. The power supply circuit comprises, for example, an internal step-down circuit, a boost circuit, and a substrate back-bias circuit.

The memory banks BNK0 to BNK15 on the lower side of the semiconductor chip in FIG. 11 are arranged to have data terminals of numbers 0 to 8 and 18 to 26, respectively. A description will be hereinafter made of the memory bank BNK0. That is, the data terminals corresponding to 9 bits of the numbers 18, 1, 2, 21, 4, 5, 24, 7, and 26 among data terminals corresponding to 18 bits are connected to the data input/output pads 18, 1, 2, 21, 4, 5, 24, 7, and 26 through the signal paths reaching to the respective pads therefrom. The data terminals of the numbers 0, 19, 20, 3, 22, 23, 6, 25, and 8, which correspond to 9 bits and remain in the above data terminals, are connected respectively to the data input/output pads 0, 19, 20, 3, 22, 23, 6, 25, and 8 corresponding to 9 bits through the memory banks BNK1 and BNK2 opposing the memory bank BNK0.

A description will be made of the memory bank BNK3. That is, the data terminals corresponding to 9 bits of the numbers 18, 1, 2, 21, 4, 5, 24, 7, and 26 among the data terminals of these 18 bits unlike the above memory bank BNK0 are connected respectively to the data input/output pads 18, 1, 2, 21, 4, 5, 24, 7, and 26 corresponding to 9 bits through the memory banks BNK2 and BNK1 opposing the memory bank BNK3. Also, the data terminals of the numbers 0, 19, 20, 3, 22, 23, 6, 25, and 8 corresponding to 9 bits remaining in the data terminals are connected respectively to the data input/output pads 0, 19, 20, 3, 22, 23, 6, 25, and 8 through the signal paths reaching to the pads therefrom. Other memory banks are also connected in the manner same as above. When the 18-bit configuration is adopted as described above, the numbers 0 to 8 corresponding to 9 bits are selected by address information, whereby they are connected to the data input/output pads 0 to 8 arranged dispersedly as described above.

Figure 12:
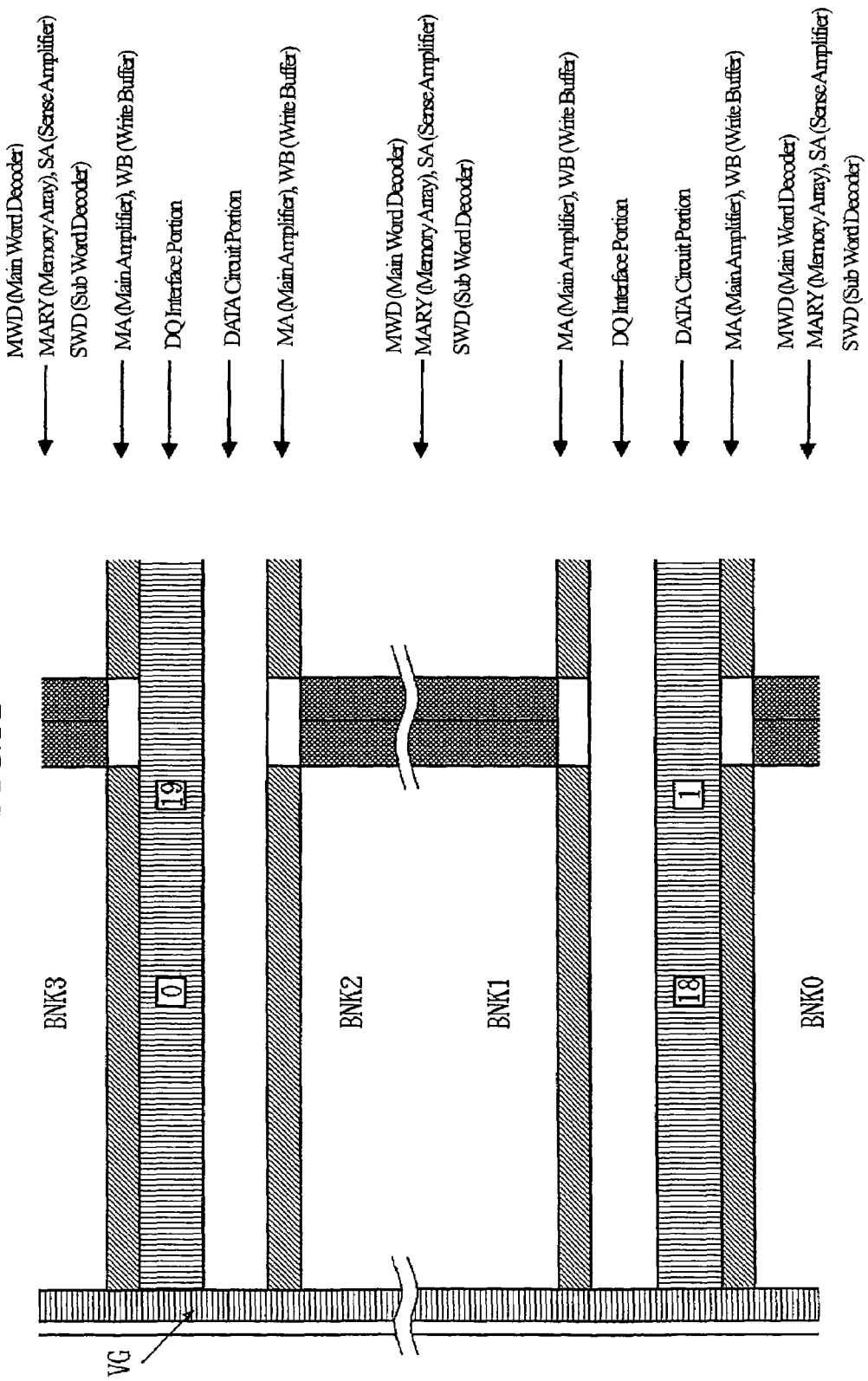
FIG. 12 is an enlarged layout diagram of FIG. 11.

In FIG. 12, an enlarged layout diagram of FIG. 11 is shown. In the Figure, portions of the memory banks BNK0, BNK1, and BNK3 are shown as an example. In each of the memory banks BNK0 to BNK3, a main amplifier MA and a write buffer WB are disposed in locations facing a DQ interface portion. In the DQ interface portions, the above-described data input/output pads 18, 1, and 0, 19 are provided. An input circuit and an output circuit are provided in the DQ interface portion. In the memory banks BNK0 to BNK3, main word decoders MWD, memory arrays MARY, sense amplifiers SA, and sub word decoders SWD as described later are provided. Note that although being not illustrated, pads for power supply are also disposed in the above-mentioned pad columns besides those for data input/output and are omitted since they are not directly related to the invention of the present application.

The DQ interface portions are disposed outside if viewed from the center of the chip, i.e., on sides of the memory banks BNK0 and BNK3. In contrast, data circuit portions are provided inside if viewed from the center of the chip, i.e., at locations adjacent to the sides of the memory banks BNK1 and BNK2. In the data circuit portion, data paths for performing signal transmission for data input/output in a vertical direction (longitudinal direction) of the chip, and drivers (relay amplifiers) for driving the data paths are provided. In the case where the data input/output pads are arranged in a two-column configuration similarly to this embodiment, when the data circuit portions are disposed inside the DQ interface portions as described above, the two columns of data circuits are configured to face each other by interposing memory arrays (memory banks BNK1 and BNK2) therebetween without being interrupted by the DQ interface portions. Therefore, the data paths in the vertical direction can be more linearly laid out.

Figure 13:
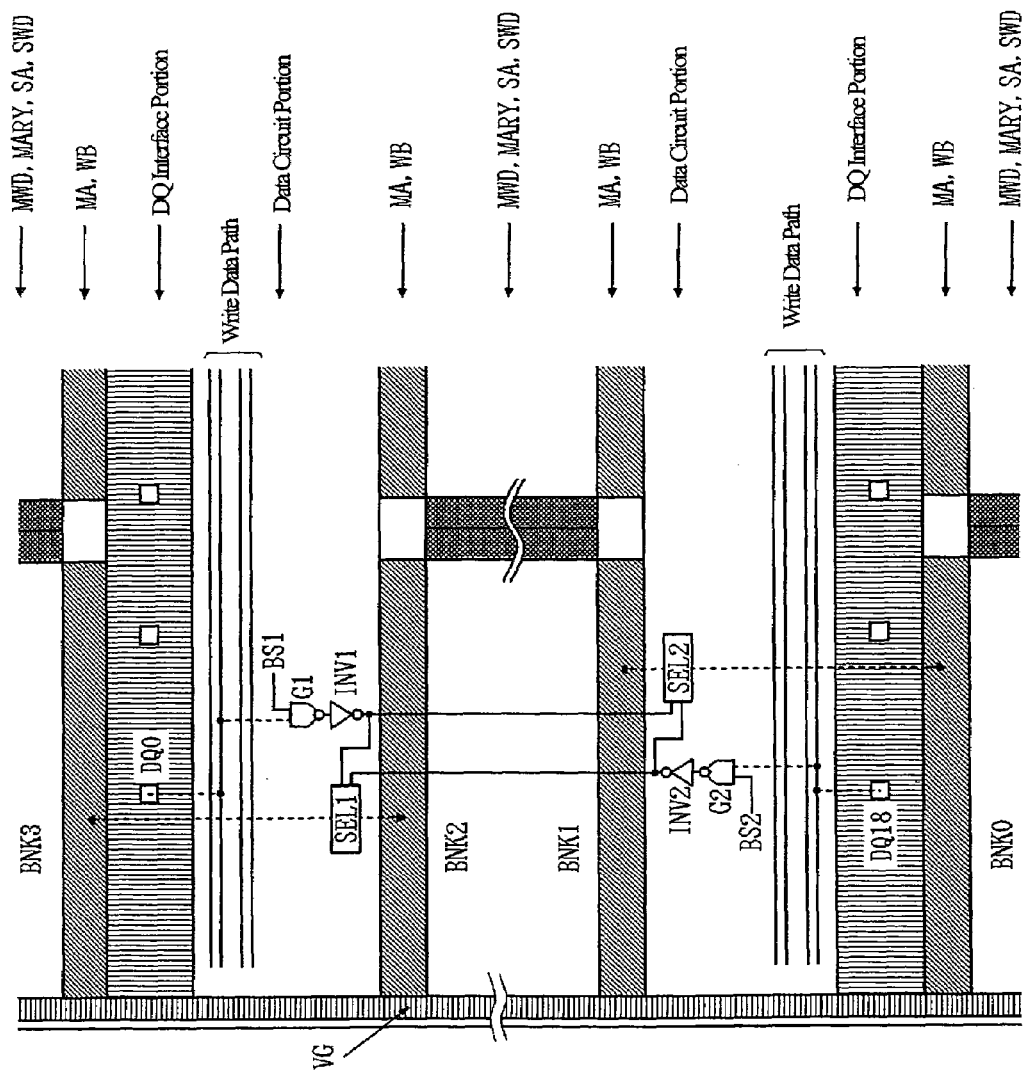
FIG. 13 is a block diagram of an embodiment of a data circuit portion of FIG. 12.

In FIG. 13, a block diagram of an embodiment of the data circuit portions of FIG. 12 is shown. In this Figure, write data paths are shown as an example. In the data circuit portion, a plurality of write data paths extending in the longitudinal direction of the chip are disposed. The write data inputted from a data input/output pad DQ0 is transmitted to selectors SEL1 and SEL2, via the write data path and through a gate circuit G1 controlled by a bank selection signal BS1 and an inverter circuit INV1 serving as a driver. The write data inputted from a data input/output pad DQ18 is transmitted to the selectors SELL and SEL2, via the write data path and through a gate circuit G2 controlled by a bank selection signal BS2 and an inverter circuit INV2 serving as a driver. As shown by the dotted lines in the Figure, the selector SELL transmits the write data to write buffers WB corresponding to the memory banks BNK2 and BNK3. As shown by the dotted lines in the Figure, the selector SEL2 transmits the write data to write buffers WB corresponding to the memory banks BNK0 and BNK1.

The signal paths shown by the dotted lines corresponding to the gate circuits G1 and G2 are data passing through flip flop circuits (clock-synchronized) from the data input/output pads DQ0 and DQ18 or data paths passing through unshown selectors (counter-test mode), as described above. The signal paths corresponding to the selectors SELL and SEL2 and shown by the dotted lines are data paths, one of which is to be selected by the selectors SEL1 or SEL2 for transmission to the write buffer WB. The bank selection signals BS1 and BS2 supplied to the gate circuits G1 and G2 do not mean selection signals of the memory banks BNK1 and BNK2 but are selection signals for selecting the four memory banks BNK0 to BNK3. From the four memory banks BNK0 to BNK3 selected by the bank selection signals BS1 and BS2, one of the four memory banks BNK0 to BNK3 is selected by another unshown bank selection signal.

Figure 14:
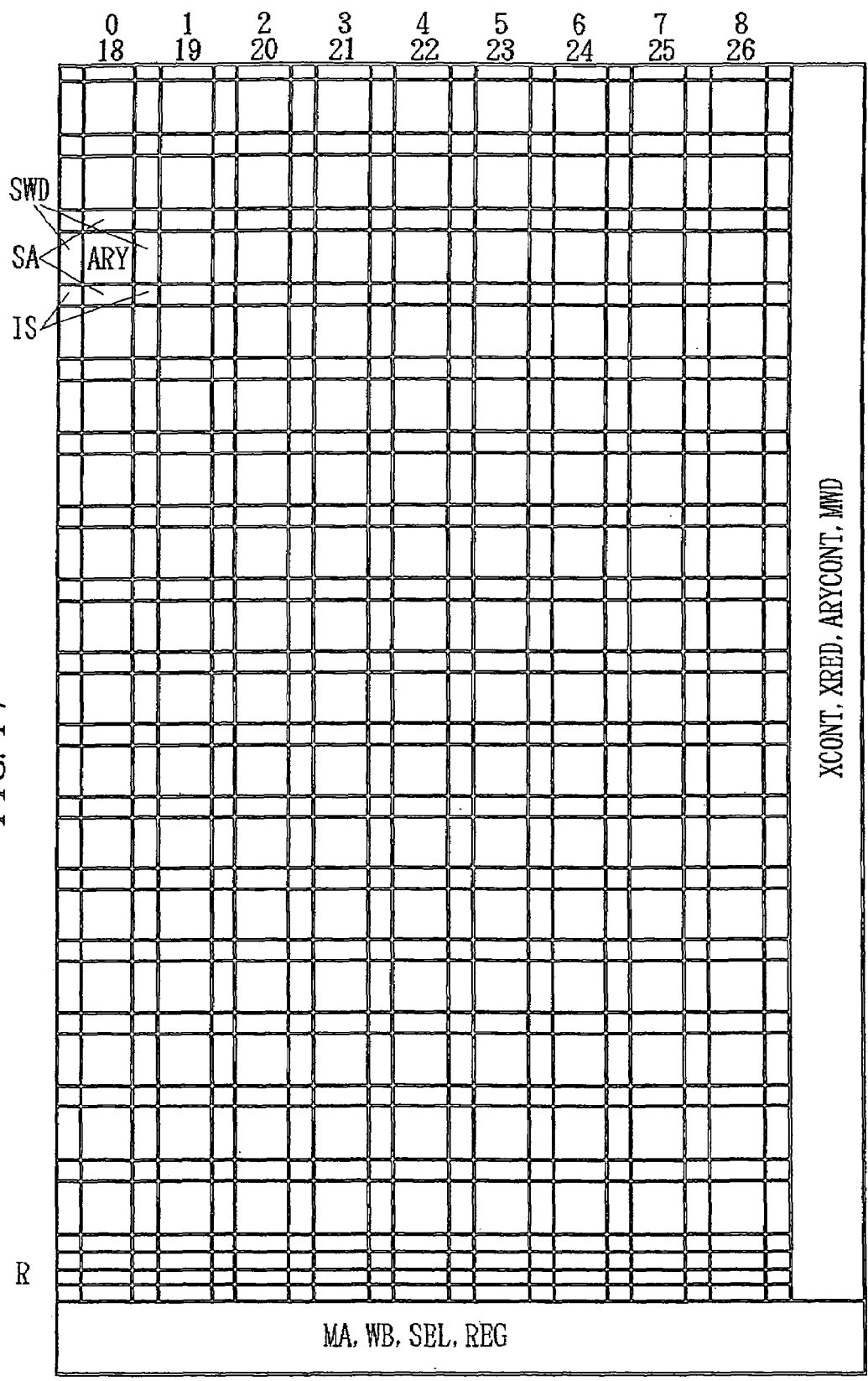
FIG. 14 is a layout diagram showing an embodiment of a memory bank of FIG. 11.

In FIG. 14, a layout diagram of an embodiment of the memory banks is shown. The memory array is divided into a plurality of sub arrays ARY. One sub array ARY is divided by sense amplifier regions SA and sub word decoder regions SWD. Crossover portions of the sense amplifier regions SA and the sub word decoder regions SWD are used as crossover regions (cross areas or intersections) IS. A sense amplifier provided in the above sense amplifier region SA is configured in a shared sense method, and complementary bit lines are provided in the left and right by regarding the sense amplifier SA as a center, except for the sense amplifiers SA disposed at both ends of the sub array ARY, and further are selectively connected to the complementary bit lines of the right or left sub array ARY.

As described above, with respect to the memory array, an X-base control circuit XCONT, an X redundant circuit XRED, an array control circuit ARYCONT, and a main word decoder MWD are provided in the main word decoder MWD of FIG. 11. The main word decoder generates a selection signal for selecting a main word line extending through a plurality of sub arrays divided by the sub word decoders SWD. In the main word driver, an X decoder for generating sub word selection signals and a driver (XCONT) are also provided, and the X decoder extends in parallel with the main word line to generate the sub word selection signals. Furthermore, in a portion adjacent to the input/output portion of FIG. 11, the main amplifier MA, the write buffer WB, a selector SEL, and a register REG are provided. The reference symbol "R" represents a redundant array.

Each memory bank of this embodiment is provided with, as shown by the register REG etc., an X/Y address buffer or an address latch. Thereby, when an address is provided to one memory bank, another address can be continuously provided to the different memory bank regardless of the memory operations thereof. That is, in the DRAM, since it takes time to retrieve the data after an input of the address, the memory accesses are made on the plurality of memory banks in a manner of pipeline. Therefore, a time consumed in a read-out operation of the individual memory banks can be apparently reduced to zero.

By a pipeline operation as described above and by being mounted on a package compatible with e.g., an SRAM, the DRAM can be used as a cache memory. That is, in comparison with the SRAM, storage capacity of the DRAM can be increased approximately four times. In contrast, the memory access takes approximately four times longer. However, due to an increase of the storage capacity, a hit rate of cache can be significantly increased. Therefore, when miss hits in the case of employing the SRAM are taken into consideration, the case of employing the DRAM according to the present invention is advantageous in terms of a total operation speed. Particularly, it is advantageous in, for example, a micro computer having a comparatively small capacity and performing signal processings.

As described above, the invention made by the present inventors has been specifically described based on the above-mentioned embodiments. However, needless to say, the present invention is not limited to the above embodiments and may be variously altered and modified without departing from the gist thereof. For example, the power switch MOSFETs for activating the sense amplifiers may be incorporated in the sense amplifier unit. That is, to correspond to the CMOS latches, the MOSFETs smaller in size than the power switches provided in the intersections may be provided. A configuration of the memory array may have various embodiments. This invention can be widely utilized as a semiconductor integrated circuit device provided with the DRAM.

What is claimed is:

1. A semiconductor integrated circuit device comprising:
   a sense amplifier provided with a CMOS latch circuit for amplifying and retaining signals of a pair of input/output nodes in response to an operation timing signal;
   a pair of precharge MOSFETs provided on said pair of input/output nodes, becoming in an on state during a precharge period, and supplying a precharge voltage to each of said input/output nodes;
   a selection switch MOSFET for connecting said pair of input/output nodes and a complementary bit-line pair in accordance with a selection signal;
   a first equalize MOSFET provided between said complementary bit-line pair and short-circuited during said precharge period; and
   a dynamic memory cell provided between one of said complementary bit-line pair and a word line intersecting therewith and including an address selection MOSFET and a storage capacitor,
   wherein gate insulators of said selection switch MOSFET and a first equalize MOSFET are made of first film-thickness gate insulators,
   a gate insulator of said precharge MOSFET is made from a second film-thickness gate insulator thinner than said first film-thickness gate insulator,
   a precharge signal corresponding to a power supply voltage is supplied to said precharge MOSFET, and
   an equalize signal and the selection signal corresponding to a boost voltage equal to or higher than said power supply voltage are supplied to said first equalize MOSFET and selection switch MOSFET, respectively.

2. The semiconductor integrated circuit device according to claim 1, further comprising:
   a second equalize MOSFET provided between said pair of input/output nodes, made from said second film-thickness gate insulator, receiving the precharge signal in response to the power supply voltage, and short-circuited during the precharge period.

3. The semiconductor integrated circuit device according to claim 2,
   wherein each of said precharge MOSFET and said second equalize MOSFET is made from the second film-thickness gate insulator formed by a same manufacturing step as that of a MOSFET constituting said sense amplifier, and
   each of said selection switch MOSFET and said first equalize MOSFET is made from the first film-thickness gate insulator formed in a same manufacturing step as that of the address selection MOSFET of said memory cell.

4. The semiconductor integrated circuit device according to claim 3,
   wherein a first selection switch MOSFET and a second selection switch MOSFET are provided on both sides so as be sandwiched between the pair of input/output nodes of said sense amplifier, and a first complementary bit-line pair and a second complementary bit-line pair are provided to correspond to said first selection switch MOSFET and said second selection switch MOSFET, and
   said first equalize MOSFET is provided on each of said first complementary bit-line pair and said second complementary bit-line pair.

5. The semiconductor integrated circuit device according to claim 4, further comprising:
   a read amplifier including an amplifier MOSFET and a column selection switch MOSFET whose gates receive an amplification signal of said sense amplifier; and
   a write amplifier for transmitting a write signal to said input/output nodes,
   wherein the read and write amplifiers are provided so as to correspond to the pair of input/output node of said sense amplifier.

6. The semiconductor integrated circuit device according to claim 5,
   wherein each of MOSFETs constituting said read amplifier and said write amplifier is made from the second film-thickness gate insulator formed in a same manufacturing step as those of said precharge MOSFET, said second equalize MOSFET, and a MOSFET constituting said sense amplifier.

7. The semiconductor integrated circuit device according to claim 6,
- wherein a sub word line orthogonal to said complementary bit-line pair is provided on said complementary bit-line pair,
- a sub array is constituted by arranging the dynamic memory cell at an intersection between said sub word line and one of said complementary bit-line pair, and
- one memory block is formed by a plurality of said sub arrays in a word-line direction and in a bit-line direction.

8. The semiconductor integrated circuit device according to claim 7,
- wherein sub word decoders are provided on both sides of the sub array in the word-line direction, and a sub word line of the sub array is selected by a main word line and a selection line for sub word line,
- the sense amplifiers are provided on both sides of the sub array in the bit-direction line, and
- at an intersection between said sense amplifier and the sub word decoder, there are disposed:
    - a power MOSFET for activating said sense amplifier, and a precharge circuit and an equalize circuit provided on a common source line of the sense amplifier;
    - a sub word selection driver for generating a sub word selection signal to be supplied to said sub word decoder; and
    - a driver for generating respective control signals of said selection switch MOSFET, said precharge MOSFET, and said first and second equalize MOSFETs.

9. The semiconductor integrated circuit device according to claim 8,
- wherein a selection switch MOSFET and the first equalize MOSFET corresponding to said sub array are disposed on both sides of said sense amplifier in the bit-line direction, said sense amplifier, the read amplifier, the write amplifier, the precharge circuit, and the second equalize MOSFET are disposed at a center of the sense amplifier in the bit-line direction, and
- in said intersection, there are disposed:
    - a drive circuit for controlling said selection switch MOSFET and said first equalize MOSFET so as to correspond thereto; and
    - a power switch MOSFET for activating the sense amplifier, and the precharge and equalize MOSFETs on the common source line of the sense amplifier so as to correspond to an arrangement of said sense amplifier.

10. The semiconductor integrated circuit device according to claim 9,
- wherein the equalize MOSFET on the common source line of said sense amplifier comprises a P-channel MOSFET and an N-channel MOSFET arranged in parallel.

* * * * *